(12) United States Patent
Bilodeau et al.

(10) Patent No.: US 12,731,021 B2
(45) Date of Patent: Sep. 8, 2026

(54) LIGHT-EMITTING DIODE NEURON

(71) Applicants: The Trustees of Princeton University, Princeton, NJ (US); Universal Display Corporation, Ewing, NJ (US)

(72) Inventors: Simon Bilodeau, Princeton, NJ (US); Paul Prucnal, Princeton, NJ (US); Michael Hack, Ewing, NJ (US); Thomas Ferreira de Lima, Princeton, NJ (US); Hsuan-Tung Peng, Princeton, NJ (US); Eric Blow, Princeton, NJ (US)

(73) Assignees: The Trustees of Princeton University; Universal Display Corporation

( * ) Notice: Subject to any disclaimer, the term of this patent is extended or adjusted under 35 U.S.C. 154(b) by 938 days.

(21) Appl. No.: 17/125,287

(22) Filed: Dec. 17, 2020

(65) Prior Publication Data

US 2021/0192330 A1 Jun. 24, 2021

Related U.S. Application Data

(60) Provisional application No. 62/949,912, filed on Dec. 18, 2019.

(51) Int. Cl.
*G06N 5/04* (2023.01)
*G06N 3/067* (2006.01)
(Continued)

(52) U.S. Cl.
CPC ............... *G06N 3/067* (2013.01); *G06N 3/08* (2013.01); *H10K 59/50* (2023.02); *H10K 65/00* (2023.02)

(58) Field of Classification Search
None
See application file for complete search history.

(56) References Cited

U.S. PATENT DOCUMENTS 4,769,292 A 9/1988 Tang
5,247,190 A 9/1993 Friend
(Continued)

FOREIGN PATENT DOCUMENTS

EP 1238981 9/2002
JP 2010135467 6/2010
(Continued)

OTHER PUBLICATIONS

Filmetrics, Inc, Taking the Mystery out of Thin-Film Measurement, 1998, pp. 1-12 (Year: 1998).*
(Continued)

*Primary Examiner* — Wilbert L Starks
(74) *Attorney, Agent, or Firm* — Riverside Law LLP

(57) ABSTRACT

A processing device comprises a plurality of artificial neurons comprising first and second artificial neurons, at least one optical connection between an optical output of the first artificial neuron and an optical input of the second artificial neuron, the optical input comprising a photosensitive element, at least one weighting element connected to the optical input of the second artificial neuron, configured to modify a gain of the optical input of the second artificial neuron, and at least one nonlinear element having an input and connected to the optical output of the first artificial neuron, configured to activate the optical output when a signal received at the input of the at least one nonlinear element rises above a threshold, wherein the optical output of the first artificial neuron comprises at least one thin film light-generating component. An LED neuron is also described.

26 Claims, 10 Drawing Sheets

(51) Int. Cl.

| | |
|---|---|
| ***G06N 3/08*** | (2023.01) |
| ***H10K 59/50*** | (2023.01) |
| ***H10K 65/00*** | (2023.01) |

(56) References Cited

U.S. PATENT DOCUMENTS

| | | | |
|---|---|---|---|
| 5,703,436 | A | 12/1997 | Forrest |
| 5,707,745 | A | 1/1998 | Forrest |
| 5,834,893 | A | 11/1998 | Bulovic |
| 5,844,363 | A | 12/1998 | Gu |
| 6,013,982 | A | 1/2000 | Thompson |
| 6,087,196 | A | 7/2000 | Sturm |
| 6,091,195 | A | 7/2000 | Forrest |
| 6,097,147 | A | 8/2000 | Baldo |
| 6,294,398 | B1 | 9/2001 | Kim |
| 6,303,238 | B1 | 10/2001 | Thompson |
| 6,337,102 | B1 | 1/2002 | Forrest |
| 6,468,819 | B1 | 10/2002 | Kim |
| 7,279,704 | B2 | 10/2007 | Walters |
| 7,431,968 | B1 | 10/2008 | Shtein |
| 7,968,146 | B2 | 6/2011 | Wagner |
| 2003/0230980 | A1 | 12/2003 | Forrest |
| 2004/0174116 | A1 | 9/2004 | Lu |
| 2013/0026452 | A1 | 1/2013 | Kottas |
| 2013/0119354 | A1 | 5/2013 | Ma |
| 2019/0311256 | A1 | 10/2019 | Hack |

FOREIGN PATENT DOCUMENTS

| | | | |
|---|---|---|---|
| WO | 2004111066 | A1 | 12/2004 |
| WO | 2008044723 | | 4/2008 |
| WO | 2008057394 | A1 | 5/2008 |
| WO | 2010011390 | A2 | 1/2010 |
| WO | 2010111175 | | 9/2010 |

OTHER PUBLICATIONS

Xu, et al., Organometal Halide Perovskite Artificial Synapses, Advanced Materials, vol. 28, Issue 28, Jul. 27, 2016, pp. 5916-5922 (Year: 2016).*

Peng, et al., Neuromorphic Photonic Integrated Circuits, IEEE Journal of Selected Topics in Quantum Electronics, vol. 24, Issue: 6, 2018, pp. 1-15 (Year: 2018).*

Romeira, et al., Regenerative Memory in Time-delayed Neuromorphic Photonic Resonators, Scientific Reports vol. 6, Article No. 19510, 2016, pp. 1-12 (Year: 2016).*

Lin, et al., All-Optical Machine Learning Using Diffractive Deep Neural Networks, arXiv:1804.08711 [cs.NE], 2018, pp. 1-20 (Year: 2018).*

George, et al., Neuromorphic Photonics with Electro-Absorption Modulators, Optics Express, vol. 27, No. 4, 2019, 5181-5191 (Year: 2019).*

Mourgias-Alexandris, et al., An All-Optical Neuron with Sigmoid Activation Function, Optics Express, vol. 27, No. 7, 2019, pp. 9620-9630 (Year: 2019).*

Abbott, L., Nelson, S. Synaptic plasticity: taming the beast. Nat Neurosci 3, 1178-1183 (2000). https://doi.org/10.1038/81453.

Ashtiani, F., Risi, A., and Aflatouni, F. (2019). Single-chip nanophotonic near-field imager, Optica 6, 1255-1260.

Baldo et al., "Highly Efficient Phosphorescent Emission from Organic Electroluminescent Devices," Nature, vol. 395, pp. 151-154 (1998).

Baldo et al., "Very High-Efficiency Green Organic Light-Emitting Devices Based on Electrophosphorescence," Appl. Phys. Lett., vol. 75, No. 1, pp. 4-6 (1999).

Boahen, K. A Retinomorphic Chip with Parallel Pathways: Encoding Increasing, On, Decreasing, and Off Visual Signals. Analog Integrated Circuits and Signal Processing (2002) 30: 121.

Ferreira de Lima, et al., "Progress in neuromorphic photonics" Nanophotonics, vol. 6, No. 3, 2017, pp. 577-599.

Furber, et al., "The SpiNNaker Project," in Proceedings of the IEEE, vol. 102, No. 5, pp. 652-665, May 2014.

Hany, et al. (2019) Recent advances with optical upconverters made from all-organic and hybrid materials, Science and Technology of Advanced Materials, 20:1, 497-510, DOI: 10.1080/14686996.2019.1610057.

L. O. Chua and L. Yang, "Cellular neural networks: theory," in IEEE Transactions on Circuits and Systems, vol. 35, No. 10, pp. 1257-1272, Oct. 1988.

LeCun, Y., Bengio, Y., & Hinton, G. (2015). Deep learning. Nature, 521(7553), 436-444.

M. S. Elbamby, C. Perfecto, M. Bennis and K. Doppler, "Toward Low-Latency and Ultra-Reliable Virtual Reality," in IEEE Network, vol. 32, No. 2, pp. 78-84, Mar.-Apr. 2018.

Nahmias, et al., "A Leaky Integrate-and-Fire Laser Neuron for Ultrafast Cognitive Computing," in IEEE Journal of Selected Topics in Quantum Electronics, vol. 19, No. 5, pp. 1-12, Sep.-Oct. 2013.

Ramuz et al., OLED and OPD-based mini-spectrometer integrated on a single-mode planar waveguide chip, Eur. Phys. J. Appl. Phys. 46 (1) 12510 (2009), DOI: 10.1051/epjap/2009025.

Simonyan, K., and Zisserman, A. (2015). Very Deep Convolutional Networks for Large-Scale Image Recognition. Published as a conference paper at ICLR 2015.

Tait, A. N., Ferreira de Lima, T., Nahmias, M. A., Miller, H. B., Peng, H.-T., Shastri, B. J., & Prucnal, P. R. (2019). Silicon Photonic Modulator Neuron. Phys. Rev. Appl., 11(6), 064043.

Watts, D., Strogatz, S. Collective dynamics of 'small-world' networks. Nature 393, 440-442 (1998). https://doi.org/10.1038/30918.

McGraw-Hill Dictionary of Physics and Mathematics, 983, (Daniel N. Lapedes ed., 1978).

* cited by examiner

LIGHT-EMITTING DIODE NEURON

CROSS-REFERENCE TO RELATED APPLICATIONS

This application claims priority to U.S. Provisional Application No. 62/949,912, filed on Dec. 18, 2019, incorporated herein by reference in its entirety.

STATEMENT REGARDING FEDERALLY SPONSORED RESEARCH OR DEVELOPMENT

This invention was made with government support under Agreement No. HR0011-19-9-0049, awarded by the Defense Advanced Research Projects Agency (DARPA). The government has certain rights in the invention.

BACKGROUND OF THE INVENTION

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety. One application for phosphorescent emissive molecules is a full color display. Industry standards for such a display call for pixels adapted to emit particular colors, referred to as "saturated" colors. In particular, these standards call for saturated red, green, and blue pixels. Color may be measured using CIE coordinates, which are well known to the art.

One example of a green emissive molecule is tris(2-phenylpyridine) iridium, denoted $Ir(ppy)_3$, which has the following structure:

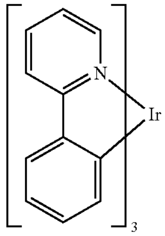

In this, and later figures herein, we depict the dative bond from nitrogen to metal (here, Ir) as a straight line.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processable" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, on a conventional energy level diagram, with the vacuum level at the top, a "shallower" energy level appears higher, or closer to the top, of such a diagram than a "deeper" energy level, which appears lower, or closer to the bottom.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

More details on OLEDs, and the definitions described above, can be found in U.S. Pat. No. 7,279,704, which is incorporated herein by reference in its entirety.

Over the last decade, artificial intelligence (AI) has reached expert level in image recognition, playing games, and natural language processing, among other endeavors. This is allowing the automation of increasingly more cognitive tasks, spurring ahead a new industrial revolution. Augmented reality (AR), where contextual graphics provided by AI are rendered on top of the real world, is poised to allow new spheres of human activity to benefit from the information age. A few examples include fixing mechanical systems, medicine, fieldwork, piloting aircraft, etc. However, the "motion-to-photon" (sensor to display) processing speeds of state-of-the-art AR systems is currently at least an order of magnitude too slow for a real-time overlay to appear seamless to a mobile human operator, which can in some instances cause "cybersickness." This slow response is often referred to as latency—a delay in a system output with respect to a given input. Furthermore, the form factor and energy consumption of these systems should be kept small. A lack of real-time processing also limits other purely AI applications such as autonomous vehicles and live recognition. Despite the inadequate technology, the global AR market is expected to grow from $5.19B in 2016 to $63.95B in 2021, and even more beyond.

One way to overcome this issue is to enable the AR sensors and displays themselves to perform AI processing. By way of example the eye and brain process information differently from typical computer systems. There, networks of independent units—neurons—exchange spike signals to distill information in a highly parallel fashion. Analogous non-spiking platforms in the form of interweaved differential equations have been considered. Dubbed "neural networks," these systems can be configured to perform computing tasks extremely quickly, simply through their dynamical evolution. The network structure determines the task that can be completed, for example classification with feedforward networks, model-predictive control with recurrent neural networks, image processing with convolutional neural networks or cellular neural network, associative memory with Hopfield networks, etc.

Cellular neural networks (or retina-like networks, retinormorphic networks) are a restricted set of neural network topologies, whereby (a) each neuron is only allowed to communicate to other neurons that are their physical or virtual neighbors, and (b) in addition to communicating its (nonlinearly activated) internal state as for regular artificial neural networks (via an "A" template), a neuron can also communicate other properties such as its input (through a "B" template), its non-activated state (through a "C" template), and even nonlinear combinations of the above (through a "D" template). For example, if a cellular network is visualized as a two-dimensional grid containing pixels, a neighborhood of size N consists of a square containing N×N pixels. While this conceptual organization of neurons is convenient for physical artificial neurons that would be organized in a 2D matrix, is not less general than the definition of a general neural network in any dimension, since N can be arbitrarily large, allowing for an arbitrary number of connections and dimensions.

How strongly neurons are connected to each other in a neural network is determined by synaptic weights. In regular neural networks, the only connections are between the output of a neuron and the input of another. Before being fed as an input, the output of the first neuron is multiplied by some value—the weight. These weights between all neuron pairs can be tabulated, and in this setup are unambiguous.

In some specific neural networks, for instance cellular neural networks, it is possible for neurons to receive as inputs more than the outputs of other neurons. In that case, it becomes important to differentiate between different types of weights. Because cellular neural networks typically exhibit only nearest-neighbor connections and are translationally invariant, these different sets of weights are termed "templates". Because traditional cellular neural networks are mainly 2D, the templates are furthermore written as matrices. For example, for first nearest-neighbour connections only, the matrix is 3×3, with the connection of any given neuron to itself being the central entry, and connections to neighbours in the corresponding entries (north on top, east on right, etc.). There is one template per type of connection. For example, the output of one neuron into the input of another (the regular weight), is often called the "A" (or feedback) template. Another popular type of connection is when some external input of one neuron is communicated to another. The corresponding weight is written in a "B" (or feedforward) template. Other, more niche, templates exist: the "C" template is the set of weights that handles communication of the internal (not nonlinearly transformed) state of a neuron; the "D" template is the weight that characterizes communication of some other nonlinear mixed function of input, output, and internal state. In the most general case, A, B, C, and D can also be nonlinear operators acting on their relevant variable instead of a simple scalar multiplication.

Although similar processes have been replicated in computing by way of computational neural networks, application of such networks to AR contexts still suffers from the same motion to photon delay phenomenon as conventional computing, albeit to a slightly lesser degree because of the increased computing efficiency of neural networks.

There have been attempts to build neural network elements using only electronics. These require a large number of electronic elements to implement the required dynamics, and when networked suffer interconnectivity problems.

An integrated neuromorphic architecture composed of LEDs and detectors was described in Y. Nitta, J. Ohta, S. Tai & K. Kyuma, "Optical neurochip for image processing," Electronics and Communications in Japan, Part 2 (Electronics), Vol. 78, No. 1, pp. 10-20, January 1995. and related articles. At the time, all-electrical analog neural networks were very popular. Optical neural networks also existed, but these were based on free-space interconnections. In such schemes, an array of light sources is illuminated on a 2D (often reconfigurable) plate that modifies its transmission in space, and the output rays are focused onto an array of photodetectors to perform summing. The referenced system, termed "optical neurochip", was basically a 1-1 integration of such spatial optical neural networks. A gallium arsenide platform was used, and reconfigurable weights were implemented via photodetectors with tunable responsivity. However, inputs were effectively one-dimensional and outputs one-dimensional. The LED in the referenced system exists only to encode (one-dimensional) inputs, each detector performs the function of multiplying an input with a weight, and summing occurs by routing all the photocurrents in each column together. The nonlinearity in the referenced system is performed in the peripheral circuitry on the summed signals in each column.

The architecture disclosed below contrasts with, and includes several advantages over, the referenced architecture. First, the disclosed architecture is implemented in a thin-film platform. Second, the disclosed architecture does not explicitly multiplex neurons row or column-wise, allowing the disclosed architecture to implement more modern neuromorphic photonic systems where neurons are integrated and localized. Embodiments of the disclosed system integrate the nonlinearity within each pixel, and in some embodiments exploit LED physics to supply streamlined nonlinearity, which was not contemplated in the referenced system. Interconnections of the disclosed system can be optical, and may use various degrees of freedom of light to distinguish signals; whereas in the referenced approach, different neurons needed to be connected electrically via peripheral electronics.

The physics of a neuron impose some changes to typical neural network theory when implemented in a thin film architecture. Additionally, a lone neuron cannot do much by itself: useful processing tasks are unlocked when networking large numbers of neurons together with tunable connections. Such tunable interconnections may be electrical or optical or a combination of both, but in some embodiments, independent and/or dynamic weighting of individual inputs to neurons in a network is essential to the proper functioning of a neural network. One solution is to include "weighting elements" in or around each proposed neuron element to yield non-linear input-output relations. In this way, an electrical and/or optical connection between two or more neurons could be modulated on-demand.

Thus, there is a need in the art for a display system reducing the motion-to-photon delay, by performing at least part of the computing closer to the display hardware.

SUMMARY OF THE INVENTION

In one aspect, a processing device comprises a plurality of artificial neurons comprising first and second artificial neurons, at least one optical connection between an optical output of the first artificial neuron and an optical input of the second artificial neuron, the optical input comprising a photosensitive element, at least one weighting element connected to the optical input of the second artificial neuron, configured to modify a gain of the optical input of the second artificial neuron, and at least one nonlinear element having an input and connected to the optical output of the first artificial neuron, configured to activate the optical output when a signal received at the input of the at least one nonlinear element rises above a threshold, wherein the optical output of the first artificial neuron comprises at least one thin film light-generating component.

In one embodiment, the device further comprises at least one electrical connection between an electrical output of the first artificial neuron and an electrical input of the second artificial neuron. In one embodiment, the at least one weighting element comprises an optical device configured to modulate an intensity of light received by the photodetector of the optical input of the second artificial neuron. In one embodiment, the optical device comprises a device selected from the group consisting of a liquid crystal, an interferometric modulator, a microelectromechanical device, and an electrochromic device. In one embodiment, the photosensitive element is a thin-film photosensitive element. In one embodiment, the at least one weighting element comprises an electronic device configured to modify an amplitude of an electrical signal generated at an output of the photodetector.

In one embodiment, the at least one weighting element comprises an adjustable-gain input to the photodetector. In one embodiment, the at least one nonlinear element comprises an LED. In one embodiment, the at least one nonlinear element comprises a thin film transistor inverter or other circuit having electrical gain. In one embodiment, the weighting element is reconfigurable. In one embodiment, the nonlinear element is reconfigurable. In one embodiment, the second artificial neuron comprises a plurality of optical inputs and a plurality of weighting elements connected to the plurality of optical inputs, a nonlinear element having an input and an output, an optical output connected to the output of the nonlinear element, and a summation element connected to a plurality of outputs of the plurality of weighting elements, configured to sum the plurality of outputs of the plurality of weighting elements and deliver the result to the nonlinear element.

In one embodiment, the summation element is the photosensitive element. In one embodiment, the second artificial neuron comprises a memory. In one embodiment, the memory is configured to store a quantity of information received from the first artificial neuron. In one embodiment, the memory is configured to store a quantity of information received from a third artificial neuron. In one embodiment, the device further comprises a sensor communicatively connected to an input of the first artificial neuron. In one embodiment, the sensor is selected from the group consisting of an image sensor, an attitude sensor, a position sensor, an accelerometer, a magnetometer, a charge-couples device, an organic image sensor, a photodetector, a LIDAR, and an ultrasonic sensor. In one embodiment, the sensor is configured to generate an electrical signal in response to a mechanical, chemical, electrical, or radiation stimulus.

In one aspect, an LED neuron comprises at least one thin film light emitting diode (LED) having an electrical input, a set of at least one photodetector configured to receive light, with an output electrically connected to the electrical input of the at least one LED, an input optical link optically connected to at least one photodetector of the set, a decay circuit electrically connected to the electrical input of the at least one LED, and a current pumping circuit electrically connected to the electrical input of the at least one LED, wherein an optical output of the at least one LED has a nonlinear relationship to a state of the output of the photodetector, the decay circuit, and the current pumping circuit. In one embodiment, the neuron further comprises a positive feedback optical link optically connecting an output of the at least one LED to the input of at least one photodetector of the set. In one embodiment, the neuron further comprises a current-voltage converter electrically connected to the electrical input of the LED, wherein when the current-voltage converter saturates, the LED neuron is configured to create a stable high illumination point.

In one embodiment, the neuron further comprises a current-voltage converter electrically connected to the electrical input of the LED, wherein when the current-voltage converter saturates, the LED neuron is configured to create a stable low illumination point. In one embodiment, the LED is configured to turn off at the stable low illumination point. In one embodiment, the LED neuron is configured to generate a maximal or minimal luminance in response to light emitted from one or more other LED neurons and an input image. In one embodiment, the neuron further comprises a plurality of weight cells configured to control how much light and what polarity of light is transmitted to one or more other LED neurons. In one embodiment, each weight of the plurality of weight cells comprises the same elements as the LED neuron, and each weight of the plurality of weight cells comprises more transistors than the LED neuron, configured to implement variable gain.

In one embodiment, the neuron further comprises at least one controllable attenuator configured to controllably attenuate the light received by the at least one photodetector. In one embodiment, the at least one controllable attenuator comprises a liquid crystal. In one embodiment, the neuron further comprises at least one color filter configured to filter the light received by the at least one photodetector. In one embodiment, the neuron further comprises a light path configured to transmit a light emitted from the LED to the at least one photodetector in a feedback configuration. In one embodiment, the LED is an OLED.

In one aspect, a neural network comprises a plurality of LED neurons as described herein, and a plurality of cells connected to the plurality of LED neurons, wherein each weight of the plurality of cells comprise the same elements as the LED neuron, and wherein each weight of the plurality of cells comprise more transistors than the LED neuron, configured to implement variable gain. In one embodiment, the plurality of LED neurons are semiconductor OLED neurons.

BRIEF DESCRIPTION OF THE DRAWINGS

The foregoing purposes and features, as well as other purposes and features, will become apparent with reference to the description and accompanying figures below, which are included to provide an understanding of the invention and constitute a part of the specification, in which like numerals represent like elements, and in which.

DETAILED DESCRIPTION

Figure 1:
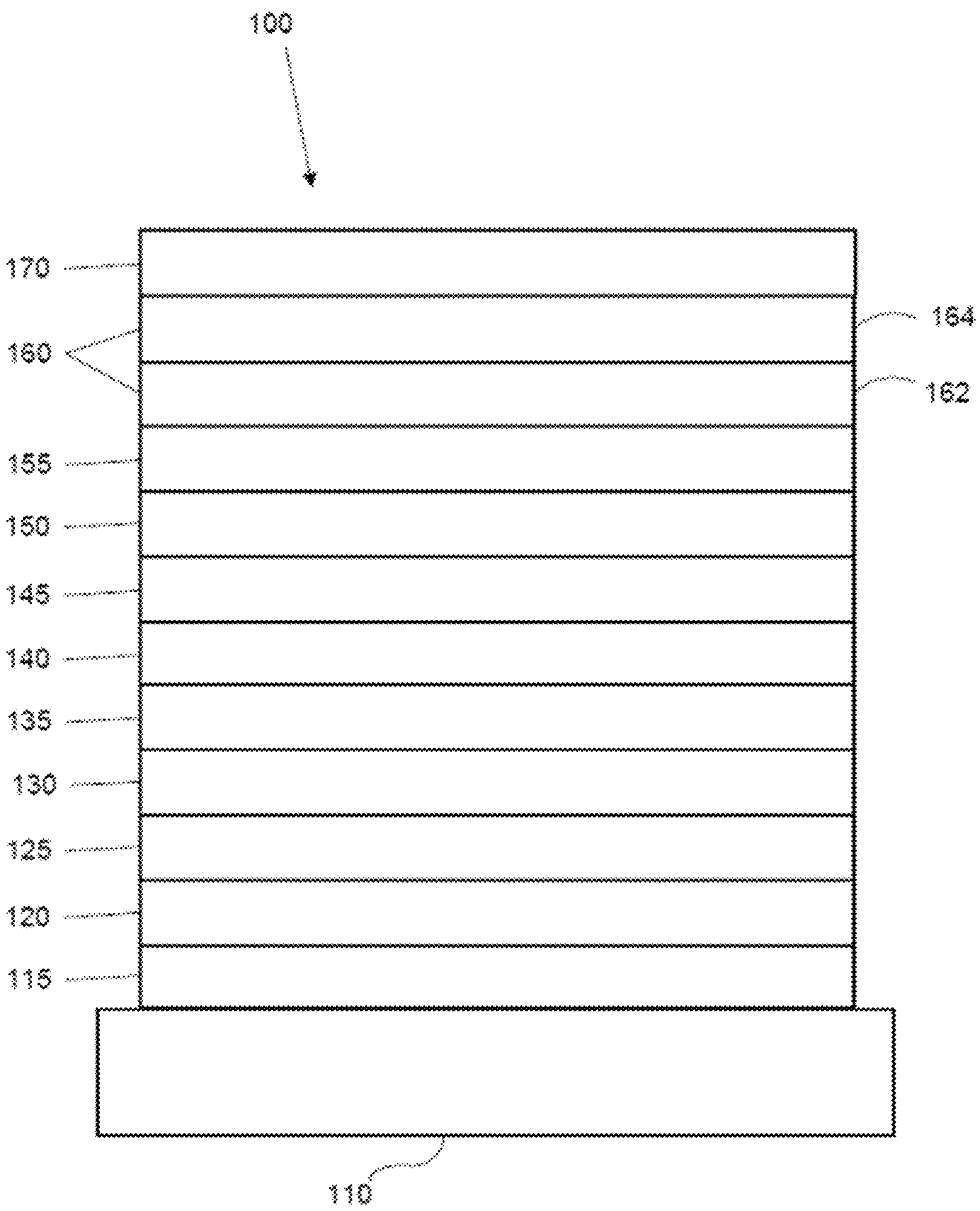
FIG. 1 shows an organic light emitting device.

It is to be understood that the figures and descriptions of the present invention have been simplified to illustrate elements that are relevant for a clear understanding of the present invention, while eliminating, for the purpose of clarity, many other elements found in related systems and methods. Those of ordinary skill in the art may recognize that other elements and/or steps are desirable and/or required in implementing the present invention. However, because such elements and steps are well known in the art, and because they do not facilitate a better understanding of the present invention, a discussion of such elements and steps is not provided herein. The disclosure herein is directed to all such variations and modifications to such elements and methods known to those skilled in the art.

Unless defined otherwise, all technical and scientific terms used herein have the same meaning as commonly understood by one of ordinary skill in the art to which this invention belongs. Although any methods and materials similar or equivalent to those described herein can be used in the practice or testing of the present invention, exemplary methods and materials are described.

As used herein, each of the following terms has the meaning associated with it in this section.

The articles "a" and "an" are used herein to refer to one or to more than one (i.e., to at least one) of the grammatical object of the article. By way of example, "an element" means one element or more than one element.

"About" as used herein when referring to a measurable value such as an amount, a temporal duration, and the like, is meant to encompass variations of ±20%, ±10%, ±5%, ±1%, and ±0.1% from the specified value, as such variations are appropriate.

Throughout this disclosure, various aspects of the invention can be presented in a range format. It should be understood that the description in range format is merely for convenience and brevity and should not be construed as an inflexible limitation on the scope of the invention. Accordingly, the description of a range should be considered to have specifically disclosed all the possible subranges as well as individual numerical values within that range. For example, description of a range such as from 1 to 6 should be considered to have specifically disclosed subranges such as from 1 to 3, from 1 to 4, from 1 to 5, from 2 to 4, from 2 to 6, from 3 to 6 etc., as well as individual numbers within that range, for example, 1, 2, 2.7, 3, 4, 5, 5.3, 6 and any whole and partial increments therebetween. This applies regardless of the breadth of the range.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), which are incorporated by reference in their entireties. Phosphorescence is described in more detail in U.S. Pat. No. 7,279,704 at cols. 5-6, which are incorporated by reference.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
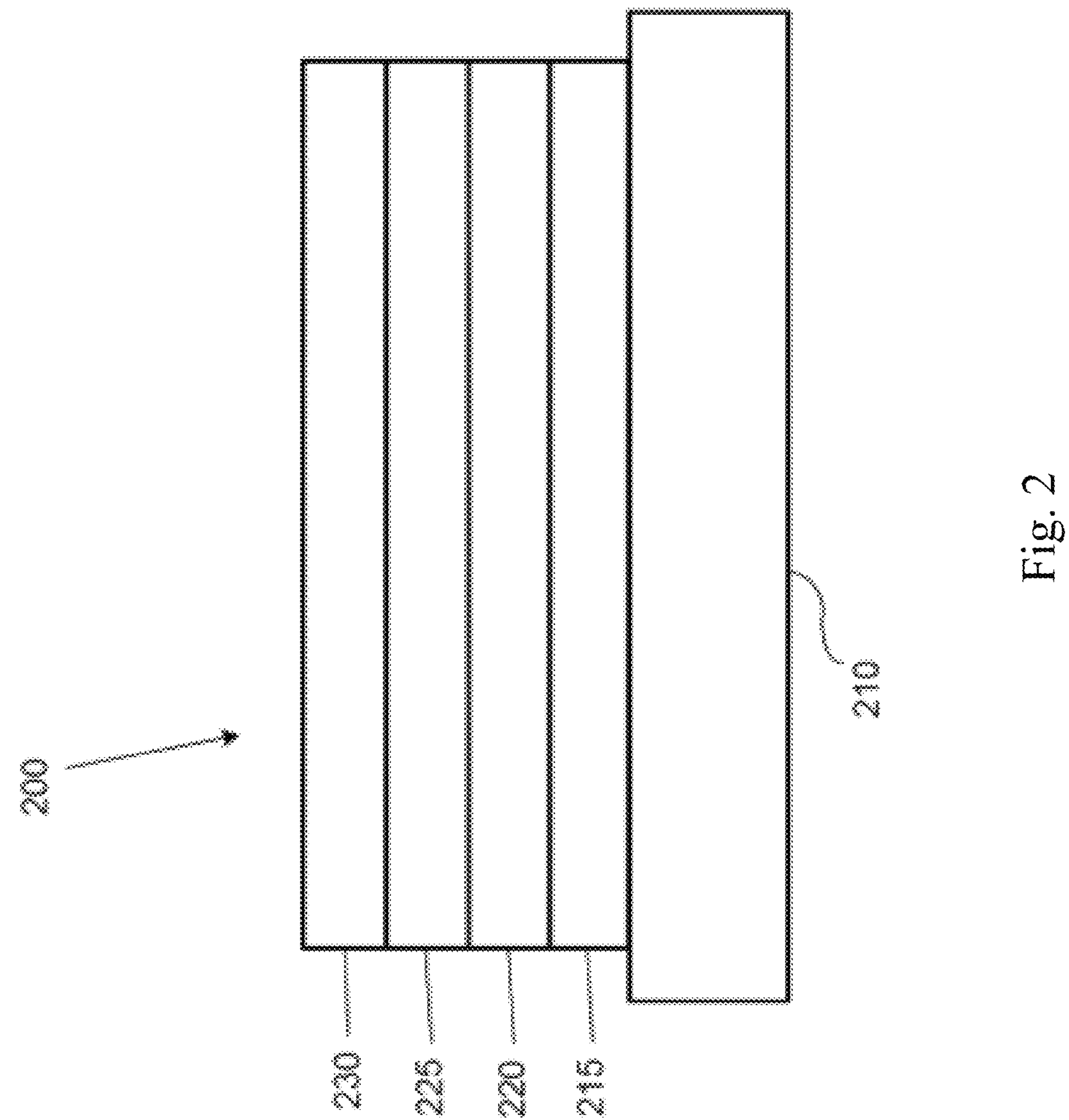
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the disclosure may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve outcoupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink-jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processability than those having symmetric structures, because asymmetric materials may have a lower tendency to recrystallize. Dendrimer substituents may be used to enhance the ability of small molecules to undergo solution processing.

Devices fabricated in accordance with embodiments of the present disclosure may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/US2007/023098 and PCT/US2009/042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

Devices fabricated in accordance with embodiments of the disclosure can be incorporated into a wide variety of electronic component modules (or units) that can be incorporated into a variety of electronic products or intermediate components. Examples of such electronic products or intermediate components include display screens, lighting devices such as discrete light source devices or lighting panels, etc. that can be utilized by the end-user product manufacturers, and cameras or other devices including optical or other sensors. Such electronic component modules can optionally include the driving electronics and/or power source(s). Devices fabricated in accordance with embodiments of the disclosure can be incorporated into a wide variety of consumer products that have one or more of the electronic component modules (or units) incorporated therein. A consumer product comprising an OLED that includes the compound of the present disclosure in the organic layer in the OLED is disclosed. Such consumer products would include any kind of products that include one or more light source(s) and/or one or more of some type of visual displays. Some examples of such consumer products include flat panel displays, curved displays, computer monitors, medical monitors, televisions, billboards, lights for interior or exterior illumination and/or signaling, heads-up displays, fully or partially transparent displays, flexible displays, rollable displays, foldable displays, stretchable displays, laser printers, telephones, mobile phones, tablets, phablets, personal digital assistants (PDAs), wearable devices, laptop computers, digital cameras, camcorders, viewfinders, other imaging devices, micro-displays (displays that are less than 2 inches diagonal), 3-D displays, virtual reality or augmented reality displays, vehicles, video walls comprising multiple displays tiled together, theater or stadium screen, and a sign. Various control mechanisms may be used to control devices fabricated in accordance with the present disclosure, including passive matrix and active matrix. Many of the devices are intended for use in a temperature range comfortable to humans, such as 18 C to 30 C, and more preferably at room temperature (20-25 C), but could be used outside this temperature range, for example, from −40 C to 80 C.

Although exemplary embodiments described herein may be presented as methods for producing particular circuits or devices, for example OLEDs, it is understood that the materials and structures described herein may have applications in devices other than OLEDs. For example, other optoelectronic devices such as organic solar cells and organic photodetectors may employ the materials and structures. More generally, organic devices, such as organic transistors, or other organic electronic circuits or components, may employ the materials and structures.

In some embodiments, the OLED has one or more characteristics selected from the group consisting of being flexible, being rollable, being foldable, being stretchable, and being curved. In some embodiments, the OLED is transparent or semi-transparent. In some embodiments, the OLED further comprises a layer comprising carbon nanotubes.

In some embodiments, the OLED further comprises a layer comprising a fluorescent emitter, a delayed fluorescent emitter, a phosphorescent emitter, a thermally assisted delayed fluorescent emitter (TADF) or a phosphorescent sensitized fluorescent emitter. In some embodiments, the OLED comprises a RGB pixel arrangement or white plus color filter pixel arrangement. In some embodiments, the OLED is a mobile device, a hand held device, or a wearable device. In some embodiments, the OLED is a display panel having less than 10 inch diagonal or 50 square inch area. In some embodiments, the OLED is a display panel having at least 10 inch diagonal or 50 square inch area. In some embodiments, the OLED is a lighting panel.

In some embodiments of the emissive region, the emissive region further comprises a host.

In some embodiments, the compound can be an emissive dopant. In some embodiments, the compound can produce emissions via phosphorescence, fluorescence, thermally activated delayed fluorescence, i.e., TADF (also referred to as E-type delayed fluorescence; see, e.g., U.S. application Ser. No. 15/700,352, which is hereby incorporated by reference in its entirety), triplet-triplet annihilation, or combinations of these processes.

The OLED disclosed herein can be incorporated into one or more of a consumer product, an electronic component module, and a lighting panel or an imaging device. The organic layer can be an emissive layer and the compound can be an emissive dopant in some embodiments, while the compound can be a non-emissive dopant in other embodiments.

The organic layer can also include a host. In some embodiments, two or more hosts are preferred. In some embodiments, the hosts used maybe a) bipolar, b) electron transporting, c) hole transporting or d) wide band gap materials that play little role in charge transport. In some embodiments, the host can include a metal complex. The host can be an inorganic compound.

One aspect of the disclosure improves upon one or more techniques based on a re-entrant shadow mask disclosed in U.S. Pat. No. 6,013,538 issued on Jan. 11, 2000 to Burrows et al., the contents of which is incorporated herein by reference in its entirety.

In some aspects of the present invention, software executing the instructions provided herein may be stored on a non-transitory computer-readable medium, wherein the software performs some or all of the steps of the present invention when executed on a processor.

Aspects of the invention relate to algorithms executed in computer software. Though certain embodiments may be described as written in particular programming languages, or executed on particular operating systems or computing platforms, it is understood that the system and method of the present invention is not limited to any particular computing language, platform, or combination thereof. Software executing the algorithms described herein may be written in any programming language known in the art, compiled or interpreted, including but not limited to C, C++, C#, Objective-C, Java, JavaScript, MATLAB, Python, PHP, Perl, Ruby, or Visual Basic. It is further understood that elements of the present invention may be executed on any acceptable computing platform, including but not limited to a server, a cloud instance, a workstation, a thin client, a mobile device, an embedded microcontroller, a television, or any other suitable computing device known in the art.

Parts of this invention are described as software running on a computing device. Though software described herein may be disclosed as operating on one particular computing device (e.g. a dedicated server or a workstation), it is understood in the art that software is intrinsically portable and that most software running on a dedicated server may also be run, for the purposes of the present invention, on any of a wide range of devices including desktop or mobile devices, laptops, tablets, smartphones, watches, wearable electronics or other wireless digital/cellular phones, televisions, cloud instances, embedded microcontrollers, thin client devices, or any other suitable computing device known in the art.

Similarly, parts of this invention are described as communicating over a variety of wireless or wired computer networks. For the purposes of this invention, the words "network", "networked", and "networking" are understood to encompass wired Ethernet, fiber optic connections, wireless connections including any of the various 802.11 standards, cellular WAN infrastructures such as 3G, 4G/LTE, or 5G networks, Bluetooth®, Bluetooth® Low Energy (BLE) or Zigbee® communication links, or any other method by which one electronic device is capable of communicating with another. In some embodiments, elements of the networked portion of the invention may be implemented over a Virtual Private Network (VPN).

In some embodiments, at least one of the anode, the cathode, or a new layer disposed over the organic emissive layer functions as an enhancement layer. The enhancement layer comprises a plasmonic material exhibiting surface plasmon resonance that non-radiatively couples to the emitter material and transfers excited state energy from the emitter material to non-radiative mode of surface plasmon polariton. The enhancement layer is provided no more than a threshold distance away from the organic emissive layer, wherein the emitter material has a total non-radiative decay rate constant and a total radiative decay rate constant due to the presence of the enhancement layer and the threshold distance is where the total non-radiative decay rate constant is equal to the total radiative decay rate constant. In some embodiments, the OLED further comprises an outcoupling layer. In some embodiments, the outcoupling layer is disposed over the enhancement layer on the opposite side of the organic emissive layer. In some embodiments, the outcoupling layer is disposed on opposite side of the emissive layer from the enhancement layer but still outcouples energy from the surface plasmon mode of the enhancement layer. The outcoupling layer scatters the energy from the surface plasmon polaritons. In some embodiments this energy is scattered as photons to free space. In other embodiments, the energy is scattered from the surface plasmon mode into other modes of the device such as but not limited to the organic waveguide mode, the substrate mode, or another waveguiding mode. If energy is scattered to the non-free space mode of the OLED other outcoupling schemes could be incorporated to extract that energy to free space. In some embodiments, one or more intervening layer can be disposed between the enhancement layer and the outcoupling layer. The examples for intervening layer(s) can be dielectric materials, including organic, inorganic, perovskites, oxides, and may include stacks and/or mixtures of these materials.

The enhancement layer modifies the effective properties of the medium in which the emitter material resides resulting in any or all of the following: a decreased rate of emission, a modification of emission line-shape, a change in emission intensity with angle, a change in the stability of the emitter material, a change in the efficiency of the OLED, and reduced efficiency roll-off of the OLED device. Placement of the enhancement layer on the cathode side, anode side, or on both sides results in OLED devices which take advantage of any of the above-mentioned effects. In addition to the specific functional layers mentioned herein and illustrated in the various OLED examples shown in the figures, the OLEDs according to the present disclosure may include any of the other functional layers often found in OLEDs.

The enhancement layer can be comprised of plasmonic materials, optically active metamaterials, or hyperbolic metamaterials. As used herein, a plasmonic material is a material in which the real part of the dielectric constant crosses zero in the visible or ultraviolet region of the electromagnetic spectrum. In some embodiments, the plasmonic material includes at least one metal. In such embodiments the metal may include at least one of Ag, Al, Au, Ir, Pt, Ni, Cu, W, Ta, Fe, Cr, Mg, Ga, Rh, Ti, Ru, Pd, In, Bi, Ca alloys or mixtures of these materials, and stacks of these materials. In general, a metamaterial is a medium composed of different materials where the medium as a whole acts differently than the sum of its material parts. In particular, optically active metamaterials are defined as materials which have both negative permittivity and negative permeability. Hyperbolic metamaterials, on the other hand, are anisotropic media in which the permittivity or permeability are of different sign for different spatial directions. Optically active metamaterials and hyperbolic metamaterials are strictly distinguished from many other photonic structures such as Distributed Bragg Reflectors ("DBRs") in that the medium should appear uniform in the direction of propagation on the length scale of the wavelength of light. Using terminology that one skilled in the art can understand: the dielectric constant of the metamaterials in the direction of propagation can be described with the effective medium approximation. Plasmonic materials and metamaterials provide methods for controlling the propagation of light that can enhance OLED performance in a number of ways.

In some embodiments, the enhancement layer is provided as a planar layer. In other embodiments, the enhancement layer has wavelength-sized features that are arranged periodically, quasi-periodically, or randomly, or sub-wavelength-sized features that are arranged periodically, quasi-periodically, or randomly. In some embodiments, the wavelength-sized features and the sub-wavelength-sized features have sharp edges.

In some embodiments, the outcoupling layer has wavelength-sized features that are arranged periodically, quasi-periodically, or randomly, or sub-wavelength-sized features that are arranged periodically, quasi-periodically, or randomly. In some embodiments, the outcoupling layer may be composed of a plurality of nanoparticles and in other embodiments the outcoupling layer is composed of a plurality of nanoparticles disposed over a material. In these embodiments the outcoupling may be tunable by at least one of varying a size of the plurality of nanoparticles, varying a shape of the plurality of nanoparticles, changing a material of the plurality of nanoparticles, adjusting a thickness of the material, changing the refractive index of the material or an additional layer disposed on the plurality of nanoparticles, varying a thickness of the enhancement layer, and/or varying the material of the enhancement layer. The plurality of nanoparticles of the device may be formed from at least one of metal, dielectric material, semiconductor materials, an alloy of metal, a mixture of dielectric materials, a stack or layering of one or more materials, and/or a core of one type of material and that is coated with a shell of a different type of material. In some embodiments, the outcoupling layer is composed of at least metal nanoparticles wherein the metal is selected from the group consisting of Ag, Al, Au, Ir, Pt, Ni, Cu, W, Ta, Fe, Cr, Mg, Ga, Rh, Ti, Ru, Pd, In, Bi, Ca, alloys or mixtures of these materials, and stacks of these materials. The plurality of nanoparticles may have additional layer disposed over them. In some embodiments, the polarization of the emission can be tuned using the outcoupling layer. Varying the dimensionality and periodicity of the outcoupling layer can select a type of polarization that is preferentially outcoupled to air. In some embodiments the outcoupling layer also acts as an electrode of the device.

The term "photosensitive element" as used in this disclosure refers to any electronic device whose electrical properties change in response to light. Examples of photosensitive elements include, but are not limited to, photodetectors, photodiodes, phototransistors, or photogates. Various exemplary embodiments of devices or systems may be presented herein including one or more particular photosensitive elements, for example photodetectors. These exemplary embodiments are not limiting, and that, as would be understood by one skilled in the art, any photosensitive element in an exemplary device may be substituted, sometimes with the addition or subtraction of additional circuitry, with another photosensitive element.

Neural Networks

In one embodiment, the dynamics of a neuron i in a cellular neural network are given by Equation 1 below.

$$\frac{dx_i}{dt} = -\frac{x_i}{\tau_i} + \sum_j A_{ij} \cdot f(x_j) + \sum_j B_{ij} \cdot u_j + I_i \quad \text{Equation 1}$$

where j represents the group of other neurons neuron i is networked with (typically a local neighborhood in the case of cellular neural networks). By extending the neighborhood to cover all other neurons in the network and allowing only diagonal feedforward template terms ($B_{ij}=B_{ii}\delta_{ij}$), "regular", non-cellular neural networks are obtained. As such, hardware that can emulate a cellular neural network can also emulate regular artificial neural networks. Note that variations of this equation exist and can also be implemented in hardware.

Throughout this disclosure, examples may be presented in the context of one or more particular types of neural network, including but not limited to a cellular neural network, a retinomorphic neural network, a recurrent neural network, a feedforward neural network, a convolutional neural network, a generative neural network, a discriminative neural network, or a Hopfield neural network. It is understood that exemplary embodiments presented in one context are not meant to be limiting on the disclosure, and that the systems and methods disclosed herein may in some embodiments be advantageously adapted to any kind of neural network. In particular, Cellular neural networks (or retinomorphic networks) are a restricted subset of general artificial neural networks that are usually implemented via software. While these restrictions make some of the embodiments more convenient to be implemented, the examples in no way limit the proposed hardware here described. Many features described in the embodiments can be extended to general neural networks topologies by anyone skilled in the art.

This equation explains how a cell state $x_i$ evolves in time. Four effects drive the evolution: 1) a decay in time, 2) the current state of the neighbors (and itself) $x_j$ through "feedback weights" $A_j$ and a nonlinear transformation $f$, 3) the input state (this is the input "image") of the neighbors (and itself) $u_k$ through "input weights" $B_k$, and 4) some pumping (bias) $I_i$. In some alternate models, the last three terms are nonlinearly transformed together. In one embodiment of a cellular neural network, the decay, pumping, action of the neighbors, and nonlinearity ensure that the cells evolve to one of a maximum or minimum state. As used herein, the term "neighbor" refers to any other cell the current cell can influence, including but not limited to physical neighbors.

Figure 4:
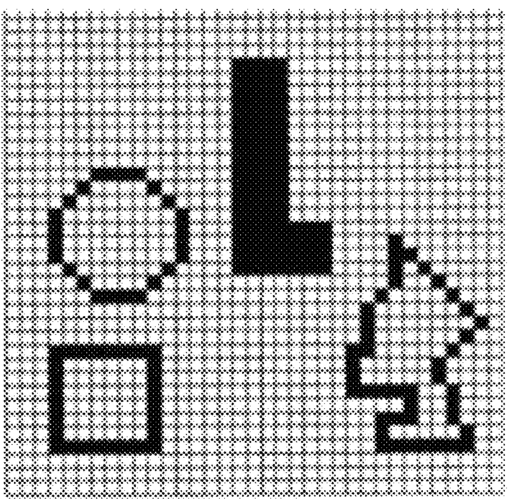
FIG. 4 shows an example of a closed curve detection algorithm.
Figure 4:
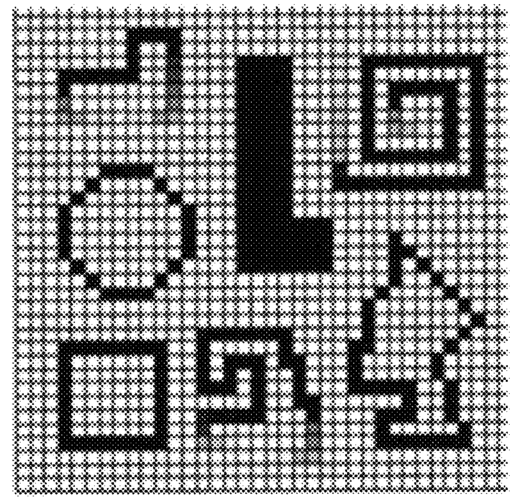
Figure 4:
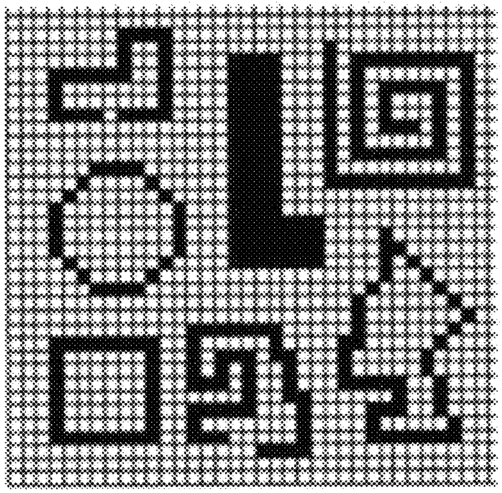

The weights are set according to what long term behavior is desired. One example is identification of closed curves by erasing open ones, as shown in FIG. 4. To achieve this, a form for the weights $A_j$ and $B_k$ are imposed as follows in Equation 2.

$$A = \begin{bmatrix} s & s & s \\ s & p & s \\ s & s & s \end{bmatrix}; B = \begin{bmatrix} r & r & r \\ r & p & r \\ r & r & r \end{bmatrix}; r = -0.5s \quad \text{Equation 2}$$

and stability conditions for the dynamical evolution are specified: namely, if a pixel $x_i$ ever only has only one black neighbor, set $$\frac{dx_i}{dt} < 0,$$

which in me current exemplary embodiment drives it to the white state, which here is defined as −1 and zero otherwise (no change). This allows s and p to be chosen to achieve the task. Arbitrary tasks can be defined this way, because in principle these systems are Turing-complete.

In the above embodiment, the nonlinear transformation f can be written as $$f(x_{ij}) = \frac{1}{2}|x_{ij} + 1| - \frac{1}{2}|x_{ij} - 1| \quad \text{Equation 3}$$

where $x_{ij}$, $y_{ij}$, $u_{ij}$, and $z_{ij}$ are the state, output, input and threshold variables of $C_{ij}$, and $a_{ij}$ and $b_{ij}$ are the synaptic weights. In general, any nonlinear function f can be made to fulfill a similar role, with weights (A, B, and others) adjusted accordingly.

As disclosed herein, a link has been identified between the mathematics governing neural networks, including but not limited to cellular neural networks, and the dynamics of electro-optic circuits comprising organic light-emitting diodes (OLEDs), the fundamental building block of many displays today. In some embodiments, methods of the disclosed approach may be used with semiconductor light emitting diodes rather than OLEDs. By doing all or part of the computation at the sensor or display level, the motion-to-photon time could be greatly improved as compared to traditional architectures.

Furthermore, the platform relies on established technology, greatly reducing the time to functional prototypes and commercialization.

The disclosed approach is based on mapping form to function. Standard neuromorphic photonics exploits the natural operation of lasers, linear optical elements, photodetectors, and modulators to physically emulate brain-like signal processing. Similarly, the high density and planar nature of OLED arrays make them suited to neurophotonic processing in highly parallel ways. As displayed in FIG. 3, by doing all or part of the computation at the sensor or display level, the motion-to-photon time could be greatly improved as compared to a traditional architecture. To realize this, two approaches will be considered: general neuromorphic computing with active matrix OLEDs, and analog "retinomorphic" image processing or display with smart pixels.

Figure 3:
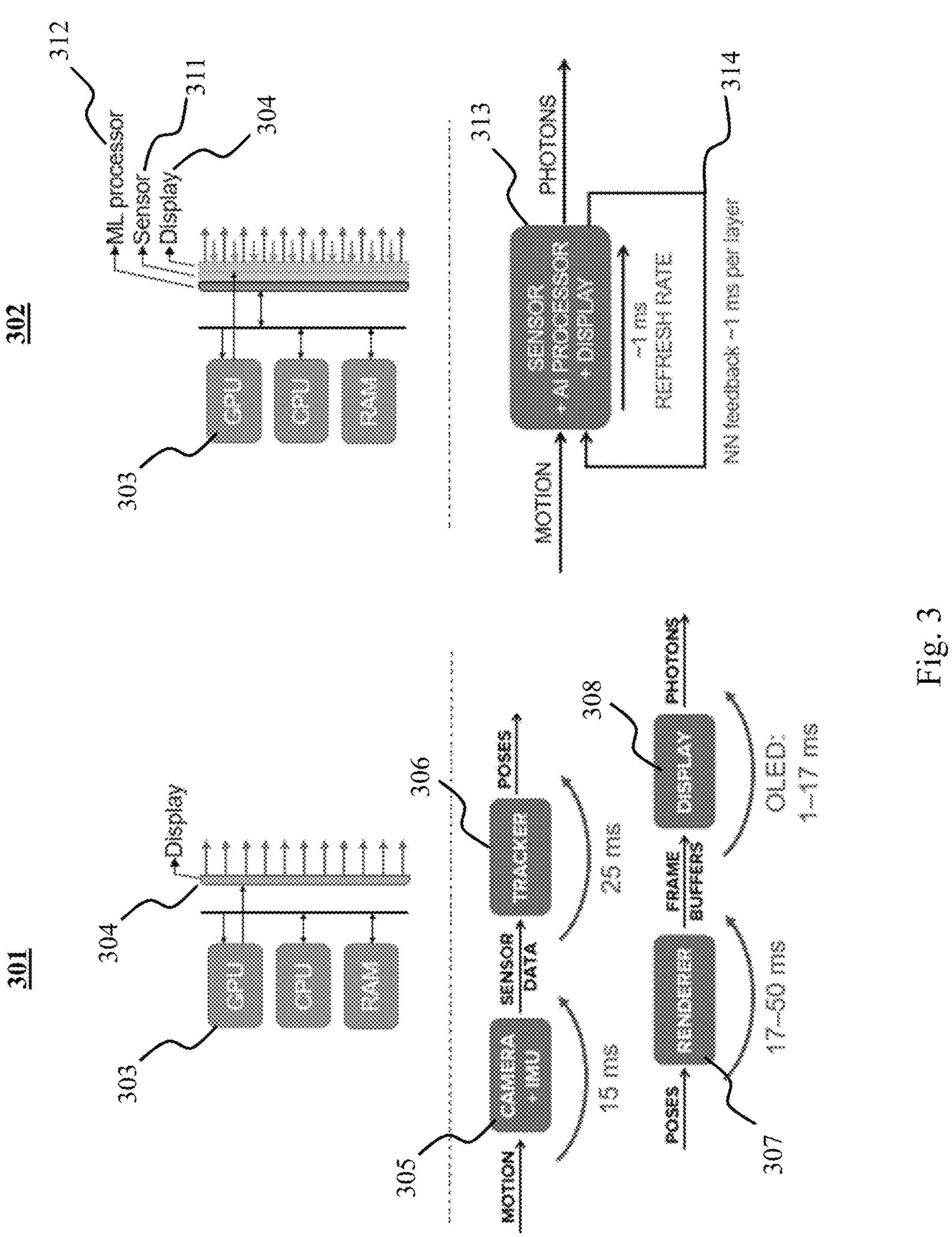
FIG. 3 shows a conventional display architecture and a corresponding exemplary display architecture with in-display processing as disclosed.

A diagram of one possible architecture enabled by the systems and methods disclosed herein is shown in FIG. 3. A traditional architecture is shown in diagram 301. As shown, a traditional processing architecture for a display incorporating data from an image sensor (for example an AR display) includes a computing back-end 303 that includes for example a graphics processing unit (GPU), a computer processing unit (CPU), and/or a quantity of random-access memory (RAM). The GPU drives the display 304. The data pipeline, shown in the lower half of diagram 301, includes motion or image data being captured by sensors 305, for example a camera and/or one or more attitude/position sensors, for example an inertial measurement unit (IMU). Other suitable input sensors include, but are not limited to, accelerometers, magnetometers, charge-coupled devices (CCDs), organic image sensors, photodetectors, LIDAR, ultrasonic sensors, or other devices where an external energy stimulus (including but not limited to a mechanical, chemical, electrical or radiation stimulus) can be converted into an electrical signal. The sensor data may then be relayed to an image processing algorithm 306, for example a motion tracker, edge detector, or the like, which extracts visual or positional data from the raw data received from the sensors. The visual/positional data is then fed to a rendering engine or algorithm 307, which in turn generates display frames for driving a display 308. Even with state-of-the-art computing, such an image acquisition and processing chain may introduce a collective delay of up to 100 ms, which when used to compute an augmented reality overlay to a scene may disorient the user. This is because images positioned in a virtual space in front of the user may noticeably lag behind the rest of the scene as the user moves her head or the scene changes.

An exemplary, more integrated architecture using the devices and methods disclosed herein is shown in diagram 302. The architecture still includes a computing back-end 303 including the same components, and a display 304, but in the depicted embodiment, the display 304 is one layer of an integrated device including sensing and computing layers 311 and 312, respectively. The display is still primarily driven by the GPU, and some processing steps may in some embodiments still be performed on the computing back end, but the computing layer (also referred to as a ML processing layer 312) may be configured to perform some or all image processing functions locally on the display, directly connected to the sensing layer 312 and display layer 304. The streamlined processing pathway is shown in the bottom half of diagram 302, in which image data is captured by the integrated display device 313, which processes the received image data and performs necessary computing steps locally using the neurons disclosed herein. A processing framework may include neural network feedback 314 through a plurality of layers, but compute time remains in the single milliseconds, far faster than the conventional architecture shown in 301 and potentially fast enough to not be noticeable to the user.

In some embodiments, the light-emitting diode neuron disclosed herein enables new processes, both on its own and even more so if networked. Specifically, the disclosed device is a new assembly of existing products that allows completely new functionalities, i.e. turning passive display elements into massively parallel computers.

In one embodiment, the disclosed approach forms a key building block of scalable photonic cellular neural networks. These networks may be implemented as fast massively parallel computing units. Such networks can be especially good at image processing tasks. Because embodiments of the disclosed photonic neuron are made of components already present in display units, this would be highly useful, for example in augmented reality applications.

For example, a general-purpose neuromorphic processor can be engineered using active-matrix OLEDs, organic photodetectors, and thin-film transistors. In one exemplary embodiment, a 5×5 mm, 1 million pixel display could be reconfigured as a single layer of 1,000 neurons where each neuron is connected to every other neuron in the array. This has advantages over purely electronic neuromorphic computing in that 1) the matrix architecture allows for extremely high interconnect capabilities, 2) summations may be performed optically in parallel, and 3) electronic components can implement weighting factors. In other embodiments, weighting factors may also be implemented in the optical layer. Also, while slower than state-of-the-art silicon photonic neuromorphic computing, the active matrix OLED approach does not require advanced optics, filters, and lasers to be developed and integrated onto expensive substrates. Systems based on this approach can readily be prototyped with existing technology, largely off-the-shelf, and such systems rely on established manufactured components. All of this greatly reduces the time to commercialization. Further examples of hybrid neuromorphic computing systems and methods may be found in U.S. patent application Ser. No. 16/376,744, filed Apr. 5, 2019 and incorporated herein by reference in its entirety.

More specialized architectures are also disclosed. Inspired by the human eye, one embodiment of a system forgoes the active matrix and make each pixel independently "smart." With photodetectors as inputs, such OLED pixel arrays could natively implement "retina-like" nearest-neighbor image processing at the source of the image. Since this forms a short time-constant dynamical system that is effectively agnostic to refresh rate, many layers could be stacked before latency becomes an issue, allowing complex computations such as convolutions to be performed quickly. In deep learning image recognition, for example, over 98% of the operations occur in the first few layers of the network. The converse problem—ultrafast reactive displays—could also be tackled, for instance by considering coherent imaging schemes within a silicon photonic backplane and the OLED as a pure display.

Embodiments of the disclosed device are made using the same fabrication procedure as for bidirectional OLED microdisplays on silicon. However, extra components—photodetectors and transistors, mainly—are assembled to give individual display elements the described functionality. The simplest specific extra electronic circuits to be added are well-known: one or more RC circuits, transimpedance amplifiers, current sources, and voltage limiters. The necessity of these components is directly mappable to the dynamics of the device.

In some embodiments, neurons disclosed herein could appear in a full-fledged network. A neural network in a display/sensor would be a natural fit for augmented reality tasks. Such a network could for instance perform real-time massively parallel image processing tasks at the image capture level. This could allow processing below the speed that causes "cybersickness" in humans, enabling augmented reality, and therefore enable the fabrication of a low latency neuromorphic processing system.

The input layer of neurons receives signals from outside instead of or in addition to other neurons. "Input neuron" as used herein means those neurons which also receive inputs from a source that is not a bias or other neurons. Anything that can be converted to an electrical or optical signal compatible with the input or next layer of neurons can work.

Specialized sensors can therefore be added to some or all of the neurons in a network as inputs. These can be from different devices (e.g. electronic sensor feeding electronic data), or can be co-integrated if made out of the same materials as the display. The latter is a feature of thin-film optically-connected neurons. For example, photodiodes of the same type as those in optically-connected neurons that take in visual information can be thin film organic or inorganic. Organic upconverters can take non-visual near-infrared light and output visible light for neural processing. Organic spectrometers can convert chemical information to localized optical signals.

In some embodiments, being able to store values for neuron elements (nonlinear units, weights, short-term memory, long-term memory, gain circuits) may be used in reconfigurable networks. Beyond local RAM, this memory can be co-integrated at the physical level at any of the levels disclosed herein. For example, an active-matrix architecture allows analog voltage values to be stored on capacitor plates. This can be used to set the responsivity of a phototransistor or the transmission of a liquid crystal filter. Analog values can also be stored in the fraction of coexisting phases of matter whose optical and electrical properties vary continuously based on the fraction.

In some embodiments, one or more neurons may comprise one or more reconfigurable elements, for example the nonlinear units, weights, short-term memory, long-term memory, gain circuits. Each reconfigurable unit may be changed either in real time or during an offline training session. The elements may be reconfigured either via local learning rules, global learning rules, or via external inputs. In such embodiments, a network may include a way to transmit information either in electronic form or optical form to each reconfigurable element in each neuron.

Neurons may be connected to one another via electrical connections, optical connections, or a combination of the two. In some embodiments, the primary output of an artificial neuron as disclosed herein may be an LED, which may be connected via an optical connection (for example a light pipe or waveguide) to one or more inputs of one or more other artificial neurons. In some embodiments, two neurons may be connected to one another via an electrical connection between an electrical output of a first neuron and an electrical input of a second neuron. Such electrical connections may be direct electrical connections, for example a simple wire or trace. However, the term "electrical connection" as contemplated herein also encompasses indirect electrical connections, for example an electrical connection through one or more intermediary devices. An indirect electrical connection is defined as any connection between two nodes where a change in potential at the first node results in a change in potential at the second node.

In order to be reconfigurable, each neuron may contain an electronic or photonic memory circuit and an electronic biasing circuit, composed of e.g. RAMs coupled to LUTs, much like in the hardware typified by in-memory computing. Reconfiguration information is stored and transmitted in digital form to other neurons or to the outside world. In order to simplify the memory circuits, neurons may be limited to volatile memory units that are loaded upon boot time from an external non-volatile memory unit.

In this scheme, an array of neurons may be organized in a 2D substrate (or in "2.5D" if arranged in a stacked configuration), each with their corresponding memory units. However, it is understood that artificial neural networks need a level of plasticity (i.e. change of internal neural states or synaptic weights) in order to function properly. The plasticity rate, i.e. the rate of change in the configuration of each neuron, is often much slower than the data processing rate performed by the neural network.

The present disclosure contemplates three kinds of plasticity rules: local, nearest-neighbor, and global. The rules offer different neural-network functionalities at different speeds.

In the local plasticity rule, a circuit in a neuron will reconfigure, or "update", itself based on the real-time data it receives as input or sends as output to other neurons. This update rule may be implemented by an electronic circuit present in a neuron, which may be fixed by fabrication or field-programmable, as in a Field Programmable Gate Array (FPGA). It is expected that a local plasticity rule would operate as fast as possible, on the order of the data rate. An example of such a rule is spike-timing-dependent plasticity (STDP), which allows the network to have unsupervised learning capabilities.

A nearest-neighbor plasticity rule is a generalization of a local plasticity rule. Here, the update rule affects not only the neuron itself, but also the neighboring neurons. Such a strategy is conducive to direct wired connections between neurons. This enables a "small-world network" topology that mimics many networks studied in both engineering and neuroscience. Systems with small-world connections display enhanced signal-propagation speed, computational power, and synchronizability. These are all desired features of a distributed reconfigurable network. Nearest-neighbor plasticity rules do not need to operate as fast as local ones. An example of a nearest-neighbor rule is rewiring a cluster of neurons to produce the same overall outputs in the event that one of them ceases to function properly.

A global plasticity rule generalizes the nearest-neighbor rules. One example of a global rule is based on the inputs and outputs of a subset of neurons in the neural network, and has the reach to affect every neuron in the network. Because such a rule is global and general, it is also the slowest. An example of such a rule in action is supervised learning, wherein the weights of hidden layers of neural networks are changed based on whether the output layer is close or not to a predetermined target.

In some embodiments, a network of neurons may comprise an addressing scheme for effective transmission of messages, parameters, or inputs to individual neurons. Generally speaking, there are two possible addressing schemes to implement reconfiguration methods with the lowest latency possible: random access or sequential access.

In a random access connectivity pattern, a reconfiguration signal may be transmitted to any neuron in the 2D or 2.5D substrate within a deterministic amount of time. This can be implemented with well-known protocols such as Address-Event Representation (AER), used extensively in the IBM TrueNorth chip, for example. The AER is itself a simplified version of the networking protocol in the world wide web, where messages are encapsulated in packets and redirected within a network via dedicated "router" circuits. This allows low-latency messages to be transmitted from one neuron to another in the network, or from the outside world to one neuron, but it imposes significant overhead because of the encapsulation and routing. Therefore, it is fast if the rate of messages transmitted in the network is small and sparse. Otherwise, there can be congestion points in each router. A random access communication scheme is well-suited for small networks, where most communication happens between neighboring neurons, and which very rarely require message transmission to the edges of the network.

Sequential access is an alternative to random access that offers better performance in the case where all neurons need reconfiguration at a single step. With the prior knowledge that all neurons need updating with as high a refresh rate as possible, a more appropriate addressing scheme is to not use any routing at all, which avoids encapsulation and header overhead. Instead, all the data may be packaged into a sequence of bits to be streamed to the neural network in bulk, and serialization and deserialization circuits may be used to unpack the stream and update one fraction of the neurons in a single step. As an example, this can be implemented like a scanline driving scheme commonly employed in flat panel displays, where a scan line selects a row to be updated, and data lines feed the required data in parallel to an entire row of neurons. A full neural network refresh can be performed by sequencing the updates row by row until the entire network has been reconfigured, much like a full frame refresh in a flat panel display.

Neurons in a network can be subdivided into two non-disjoint categories based on their input-output capability. They can take signal inputs from the world via optical or electronic sensors and detectors. They can also output signals to the world via light emitters, direct wires, or radio antennas.

Evidence from both the neuroscience and machine learning fields suggests that useful networks have an "input" layer, which is dedicated to taking inputs from the world, followed by one or more hidden layers, which do not have access to the world and cannot be probed directly, finally connected to an "output" layer, which displays the results of the computation or cognition to the world. Based on that, three methods are used for slicing the neural network into input and output layers. For simplicity, the input and output layers are referred to as I/O neurons, and the strategy can be applied to either input or output.

In a first method, I/O neurons can be organized at the perimeter of the network, forming a one-dimensional I/O. This is amenable to signals that are a one-dimensional time series, or a scalar time series that was deserialized for this purpose. An example of a one-dimensional time series is data coming from a set of sensors in parallel. An example of a scalar time series is an audio stream.

Another possible organization method is to arrange a 2D array of neurons in the network as potentially I/Os. This can be a subset of the entire neural network or its entirety. In this scheme, the neural network will be able to process 2D data arrays, e.g. images or video frames. It can also process a one-dimensional time series that was deserialized, allowing for finite impulse response filters or Fourier and other transforms to be performed in real-time.

A third method is to abandon the one-to-one neuromorphic mapping between the hardware neurons and the artificial neurons. In this case, a much larger artificial neural network is segmented into smaller chunks that fit the network implemented in hardware. At each processing step, each neuron is reconfigured to implement the chunk. Then, inputs are fed electronically or optically to the network and outputs are collected after the required processing time. The collected output is stored in memory either within the network (fast), or in a central processor outside (slow). The outputs are recorded because they may become inputs in subsequent steps. The process is repeated until all of the artificial network has been emulated. The final output is then displayed to the outside world via the central processor coordinating this operation. This scheme has a high latency in comparison with the others, as it requires breaking up a neural network into chunks, and reconfiguring the entire network for each processing step. But it offers the most flexibility in what kinds of network it can simulate.

Figure 5:
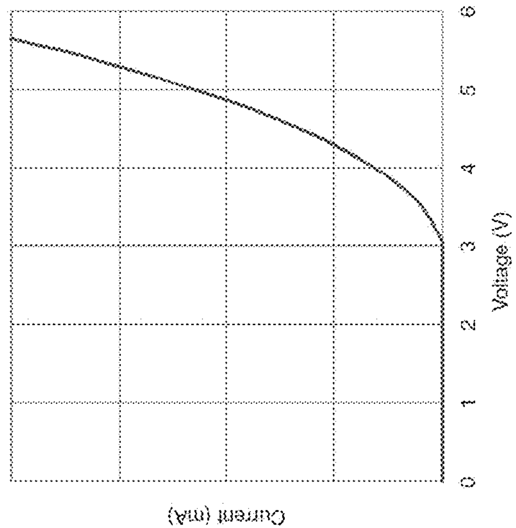
FIG. 5 shows graphs of luminance-voltage and luminance-current curves of LEDs.
Figure 5:
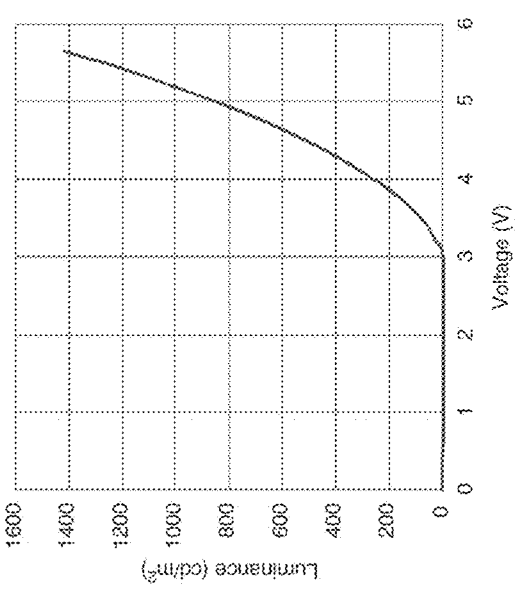
Figure 5:
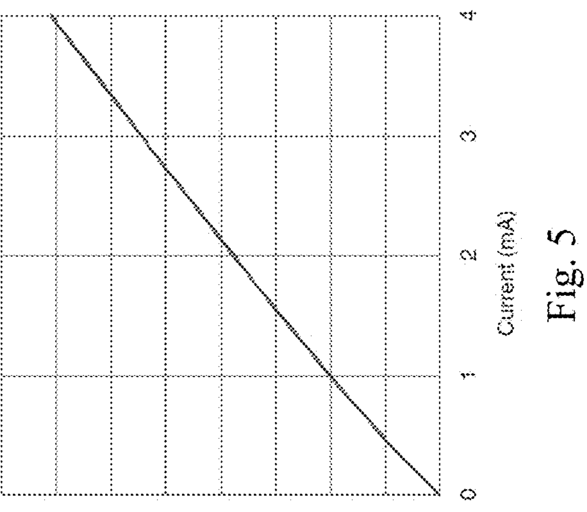

Typical displays comprise many light-generating elements arranged on a 2D grid. They are usually actuated by external circuitry at refresh rates in the kHz range, to set the operating voltages or currents required for a given display task. When the voltage or current an LED observes is changed, the LED itself responds much faster than the above kHz refresh rate. Notably, the luminance (how much light each LED emits) is nonlinearly related to voltage and linearly related to current according to the relations shown in FIG. 5.

The relationship between optical power output and current through the emissive part of the diode is approximated by $$P(I) = RI\Theta(I) \quad \text{Equation 4}$$

where the Heaviside function Θ(I) captures the electrical rectifying action of the light-emitting diode (will conduct current one way, but not the other), and R is some emission responsivity (proportionality constant, which due to higher order effects may not be purely linear). Technically, the amount of current flowing through the PN junction is an exponential function of the voltage on its terminals:

$$I = I_S\left(e^{V/nV_T} - 1\right) \quad \text{Equation 5}$$

Therefore, an exponential (all-or-nothing) response between optical output and voltage can be obtained through voltage-mode operation about the threshold voltage:

$$P(V) = R \cdot I_s\left(e^{\frac{V}{nV_T}} - 1\right)\Theta(V) \quad \text{Equation 6}$$

The step function now captures the fact that in reverse-bias, holes and electrons are not recombined in the emissive layer. These functions both represent nonlinear input-output relationships and can therefore serve as neural activation functions $f$.

Figure 6:
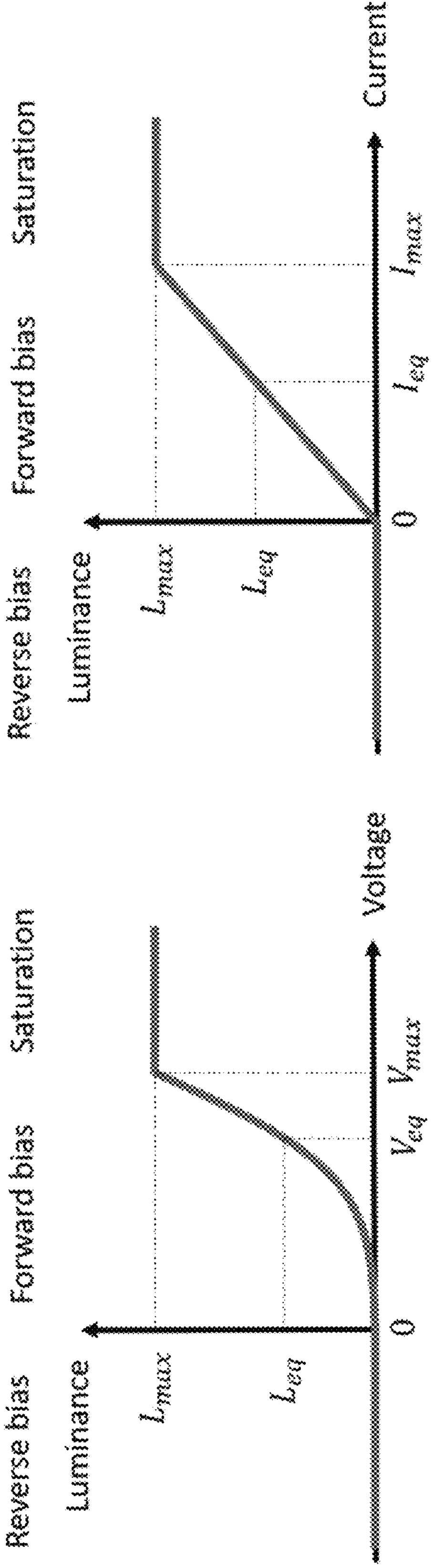
FIG. 6 shows graphs of luminance-voltage and luminance-current curves of LEDs with saturation.

In the case where the LED is driven by an amplified signal (or alternatively, if current/voltage limiters are used), the saturation behavior of the amplifier can also be captured into the nonlinear function. The relations shown in FIG. 6 are then obtained, approximated as P(I) with I=min $(I, I_{sat})$ and P(V) with V=min $(V, V_{sat})$.

These also form nonlinear functions $f$. To faithfully reproduce Equation 2, the voltage/current driving an LED may be considered as a function of the luminance (referred to interchangeably herein as optical output power) of its neighbors. Because luminance is linearly related to current when detected by a photodiode, by detecting the luminance of the neighbors with a photodiode (generating a current), the information can be acquired. One embodiment of the disclosed architecture therefore comprises light-emitting diodes, photodetectors, electrical components and optical links, as shown in FIG. 7.

Figure 7:
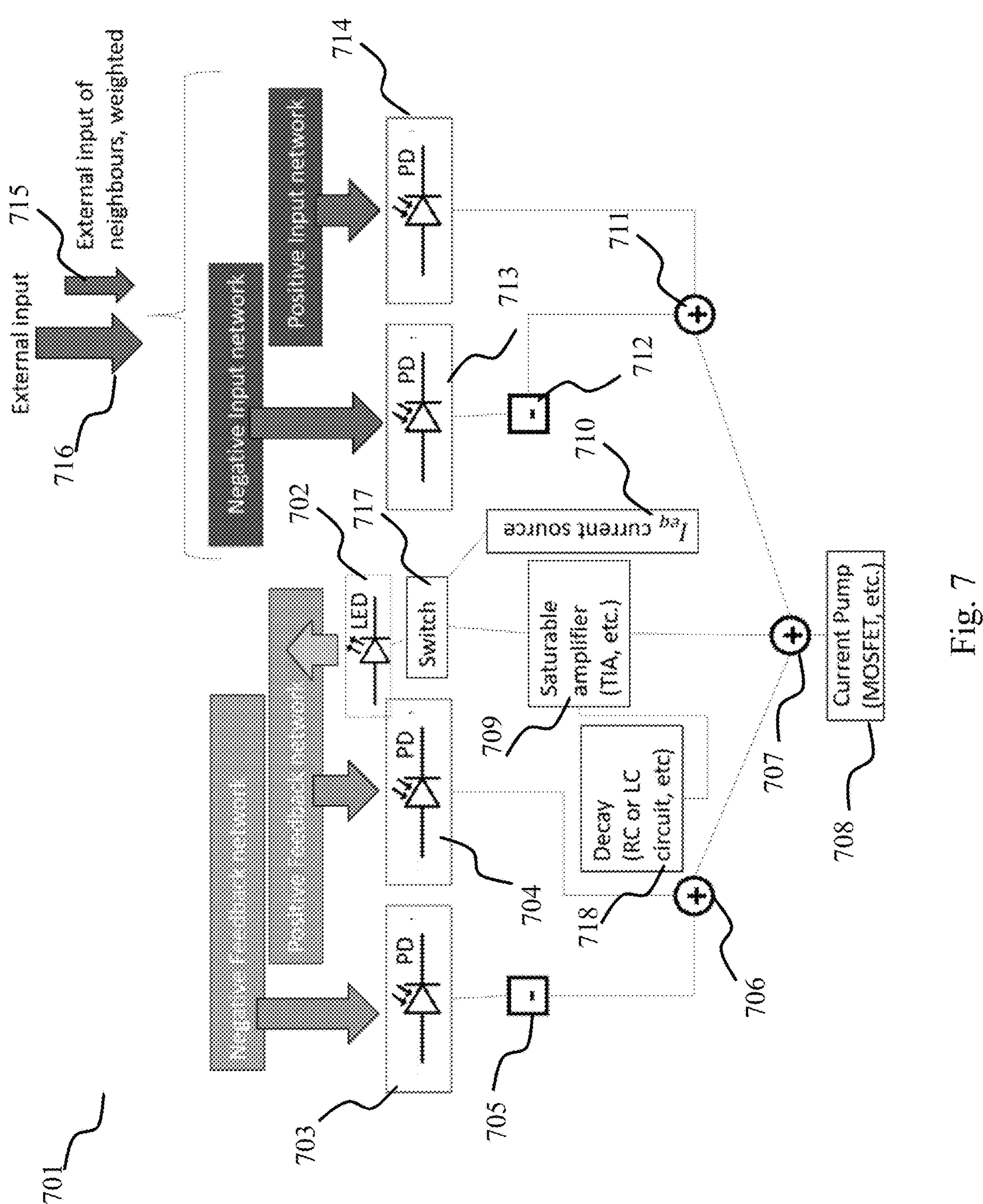
FIG. 7 shows a diagram of an exemplary LED neuron.

The exemplary architecture in FIG. 7 forms an LED neuron. The neuron 701 includes a single LED 702 and two photodetectors in a feedback network, negative feedback photodetector 703 and positive feedback photodetector 704. The neuron 701 also includes an input network with a positive input photodetector 714 and a negative input photodetector 713. The negative input and feedback networks feed into inverting or subtracting logic 712 and 705, respectively, and are then added to the positive inputs using adding logic 711 and 706, respectively.

The input network may take as input either an external input 716, for example an image in front of the display, or may also take in one or more optionally weighted inputs of one or more other neurons in the system 715, which may or may not be a neighboring neuron. The LED 702 emits light into the positive photodetector 704 to provide positive feedback.

In one exemplary embodiment, the LED 702 is driven by the output of a switch 717, which may select between the output of a saturable amplifier 709 or an equilibrium current source 710. The input to the amplifier is provided by an adding logic 707 which combines the outputs of the adding logic 706 and adding logic 711, and a fixed external bias current can be added via source 708 which may for example be a current pump such as a MOSFET. Adding logic can be as simple as routing to a common node for analog currents.

The dynamics of a single such neuron 701 comprise one unstable equilibrium point and two stable equilibrium points of maximal and minimal luminance. When decay, pumping, and self-positive feedback are balanced, the system is at an unstable equilibrium ($V_{eq}$ or $I_{eq}$ in the diagram). If the input voltage or current to the LED 702 increases slightly, the resulting increased luminance will cause even more positive current to be generated via the positive feedback link (via photodetector 704), which will cause more light to be emitted down the chain. This light will then be captured (and converted to current, etc.). Eventually the current-voltage or current-current amplifier 709 saturates, leading to a stable high illumination point. On the other hand, if voltage is slightly inhibited, less light is generated from LED 702, causing the opposite chain reaction until the LED 702 turns off.

In another embodiment, the self-positive feedback path via photodiode 704 may be removed in closer analogy to the original cellular neural network theory. In such embodiments, the decay circuit 718 may be adjusted to equilibrate at a desired intermediate luminance ("level-shifting") which will yield $L_{eq}$ (and accounting for pumping), for example by having it referenced to something other than ground. In such an embodiment case, the circuit will include an equilibrium luminance $L_{eq}$ as the only stable equilibrium point. The neuron can still be driven to high or low purely by input and feedback from itself and neighbors.

The two topologies are complementary, and either may be used alone or in combination with the other as part of a larger network. In some embodiments, the bias current can also be implemented with external illumination. In such topologies, it is possible for the light emitted from neighboring LEDs as well as the light from an input image to force a neuron to high or low illumination points. By controlling how much of this light makes it to the "neighbors" and its polarity (choosing if it strikes the + or − photodiode), the matrices A ($A_{ij}$ terms in Equations 1 and 2 above) and B ($B_{ij}$ terms in Equations 1 and 2 above) can be implemented and trained in a way similar to above to implement various tasks directly at the LED illumination level.

In one embodiment, weighting is implemented by positioning cells between each connected neuron of the same architecture, but without saturation and with transistors to implement variable gain in the electrical domain (weights). In this way, incoming light can be linearly or nonlinearly modified and then reconverted to light through a weight cell LED. Light may also be routed to the positive or negative networks, which allows determination of the sign of the weight by choosing either the LED configured to output to the + network or the LED configured to output to the − network. This can be done asymmetrically in subpixels to allow asymmetric weights (left-to-right≠right-to-left, etc.). These units can be further delineated into feedback weight subpixels A, configured to modulate light traveling between different neurons, and feedforward weight subpixels B, configured to modulate input light from outside onto their respective neurons and their neighbors). In some embodiments, more general "C" and "D" weight templates can also be included this way. In one exemplary embodiment, C can cast a non-thresholded state of a neuron onto itself and its neighbors. This can be achieved in one embodiment by tapping a neuron's current state and broadcasting it before it is nonlinearly transformed, which can be done with an unsaturable current-driven LED, and then weighted by a "C" weight unit. The most general "D" weight unit takes in multiple inputs from one neuron: its thresholded value (the one going to A), its input value (the one going to B), and its unthresholded value (the once going to C). One or more detectors can be used in a D weight cell to implement operations in the opto-electrical domain between these inputs before reconverting to light and broadcasting onto the relevant neurons. As an extension to D, some or all of the weight cells disclosed herein may be configured to depend on multiple neurons, either directly by defining new cells taking in multiple inputs like D (except corresponding to different neurons here), or indirectly by allowing different weights to affect each other.

Figure 8A:
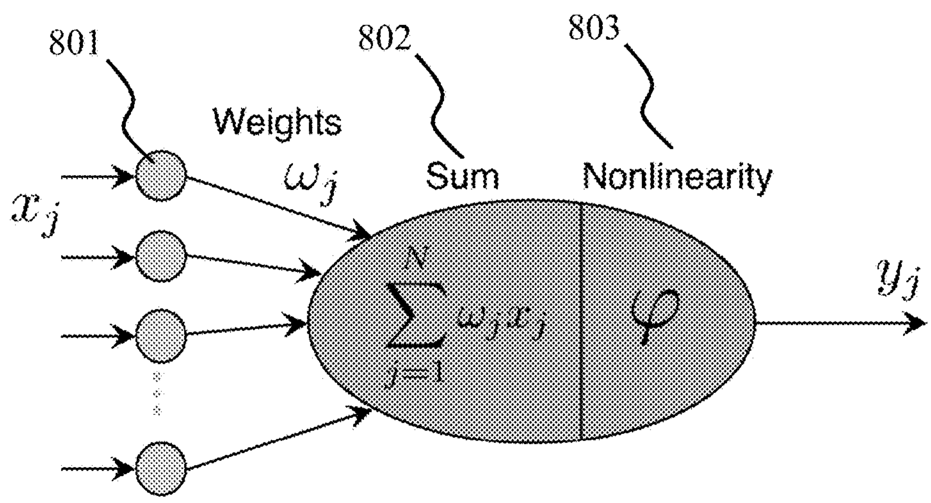
FIG. 8A shows a diagram of a conventional computational neuron.
Figure 8B:
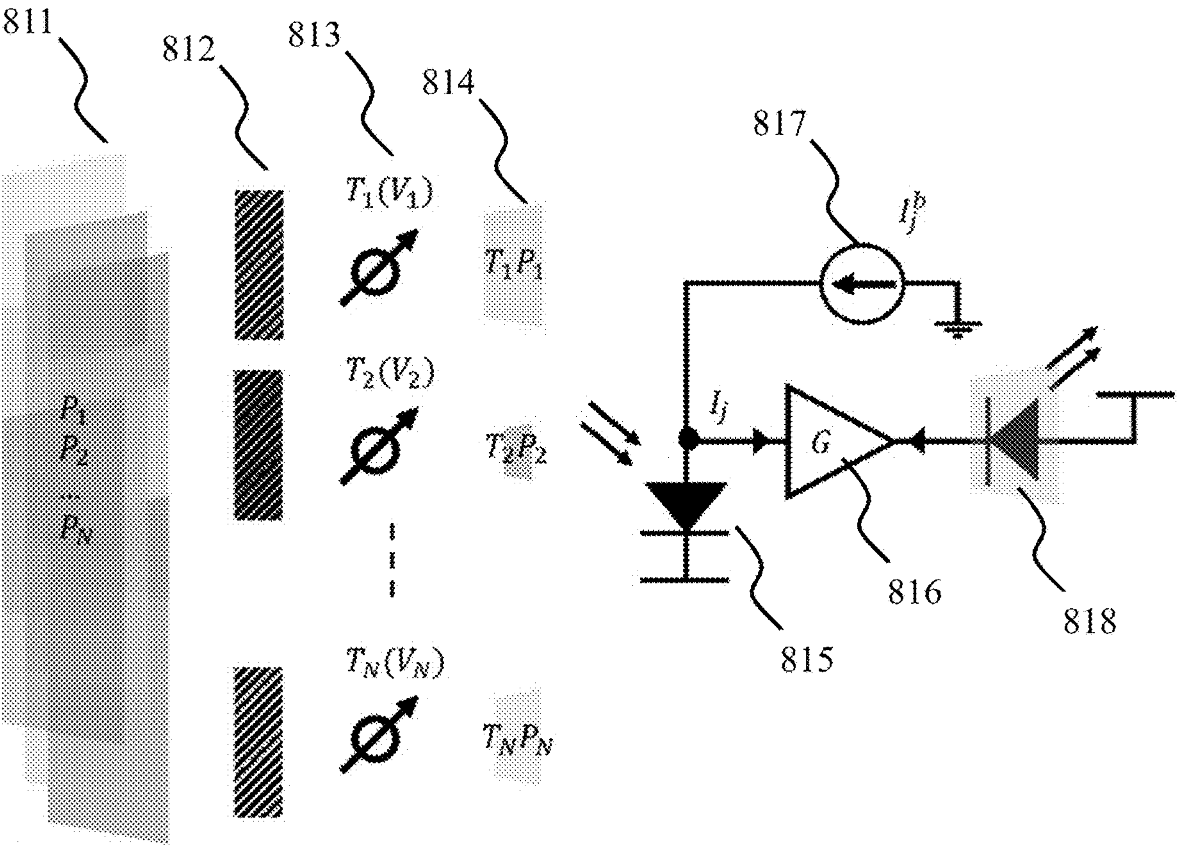
FIG. 8B shows a diagram of an exemplary LED neuron.

An embodiment of a thin-film optoelectronic neuron using an optical weighting scheme is shown in FIG. 8B, with FIG. 8A for reference. As shown in FIG. 8A, a conventional neuron includes a set of weighted inputs 801 which feed into a summation element 802, and then a nonlinear element 803 which determines whether to "fire" the neuron based on the summed weighted inputs. In some embodiments, the "firing" determination may be a result of diode physics (P(I), P(V)) as discussed above.

As understood herein, a summation element is an electrical, optical, or other element that takes in a plurality of inputs and provides a sum or combination of the inputs as an output. One example of a summation element is a summing amplifier or voltage adder. In other embodiments, a photodetector may act as a summation element, for example by accepting light having first and second intensities at first and second wavelengths to which the photodetector is sensitive, resulting in an electrical output roughly proportional to the sum of the intensities.

As understood herein, a nonlinear element is an electrical, optical, or other element having at least one input and at least one output, wherein the relationship between a magnitude of at least one output is not directly proportional to a magnitude of at least one input. One example of a nonlinear element is a single-input, single-output thresholding element where the output transitions from a low state to a high state, or vice versa, when the input rises above or falls below a predetermined threshold. In one embodiment, an inverter, for example a thin-film transistor inverter, may be used as a nonlinear element. In one embodiment, any other circuit having a nonlinear transfer function or electrical gain may be used as a nonlinear element. In a nonlinear element the output cannot be simply described as the sum of the weighted inputs, but includes some non-linear function that determines the output based on any given set of inputs. In various embodiments, a nonlinear element may be internal to a neuron or external to a neuron.

An optoelectronic implementation of this principle is shown in FIG. 8B, wherein the plurality of inputs 811 may for example be multiple wavelengths of light. These inputs 811 may be demultiplexed using color filters 812 and then may be individually weighted using variable attenuators 813, in which case $|T_k(\lambda)|<1$, selectively, for instance through some control voltage $V_{jk}$. A single photodetector may be used to sum all the optical powers into a single photocurrent:

$$I_j = I_j^b + \sum_k^N \left( \int d\lambda R_{jk}(\lambda) T_{jk}(\lambda, V_{jk}) \right) P_k \quad \text{Equation 7}$$

and hence the weighting factor $w_{jk}(V_{jk})=\int d\lambda R_{jk}(\lambda)T_{jk}(\lambda,V_{jk})$ in this scheme.

Here, optical power $P_k$ and the detector $R_{jk}$ are written as scalars. In practice these scalars result from emission and detection profiles (in free space), or mode overlap (with waveguides).

In one embodiment, the variable attenuators 813 may comprise liquid crystals like the ones currently used to attenuate light emitted from individual pixels or subpixels of an LCD display. Other display technologies whose operating mechanisms involve modulating light transmission can also be used, including but not limited to interferometric modulation, microelectromechanical devices, etc. Electrochromic elements can also be used for this purpose. In some embodiments, waveguides and/or microlenses, for example 3D-printed microlenses, may be used to help route light.

The weighted, demultiplexed inputs 814 may then be fed into one or more photodetectors 815, with the resulting signal passed through optional electronics 816 (for example a continuous-time amplifier, buffer, digital controller, fire-and-reset transistors for "spiking" amplifiers, etc.). Whether or not electronics are used, LED 818 can serve the function of the nonlinear element 803 in the conventional neuron, because LED 818 will emit no light up until the input voltage (sum of weighted inputs) crosses the threshold to move the LED from zero emission into an increasing emissive mode, increasing until the underlying electronics, should they be present, reach a saturation point.

Figures 8C, 8D:
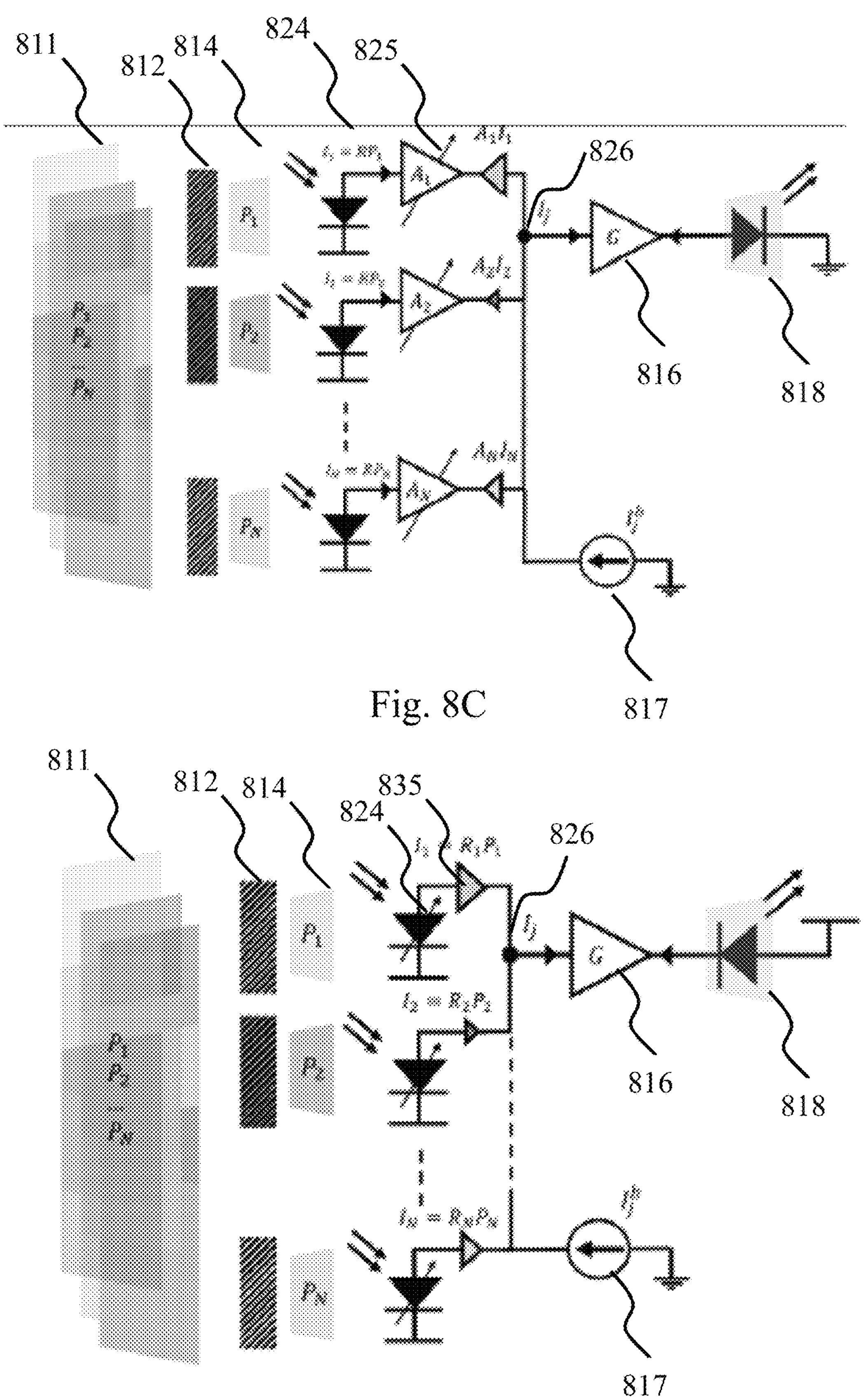
FIG. 8C shows a diagram of an exemplary LED neuron.
FIG. 8D shows a diagram of an exemplary LED neuron.

With reference to FIG. 8C, another exemplary embodiment is shown using electrical weighting for the inputs. Here, each filter 812 has an independently-wired photodetector 824 for collecting the filtered light 814. The photodetector outputs are electrically connected to tunable current gain elements 825, which may be actuated by a control voltage. The outputs are then routed to a common node 826 for summing yield $$I_j = I_j^b + \sum_k^N \left( A_k(V_{jk}) \int d\lambda R_{jk}(\lambda) T_{jk}(\lambda) \right) P_k \quad \text{Equation 8}$$

and so $w_{jk}(V_{jk})=A_k(V_{jk})\int d\lambda R_{jk}(\lambda)T_{jk}(\lambda)$ in this scheme. The tunable current gain elements may in some embodiments comprise a thin-film amplifier or transimpedance amplifier.

With reference to FIG. 8D, another exemplary embodiment is shown using in-detector weighting for the inputs. In this embodiment, the responsivity of each individually-filtered linear imager 824 can be tuned externally, allowing weighting to be performed in the individual photodetector for compactness. The summing at the common node 826 in this embodiment is defined as $$I_j = I_j^b + \sum_k^N \left( \int d\lambda R_{jk}(\lambda, V_{jk}) T_{jk}(\lambda) \right) P_k \quad \text{Equation 9}$$

and so $w_{jk}(V_{jk})=\int d\lambda R_{jk}(\lambda,V_{jk})T_{jk}(\lambda)$ in this scheme. The detector responsivity may be adjusted for example by changing the detector bias, or by changing the gate voltage of an individual phototransistor.

In some embodiments, a bias may be applied to the neuron. A bias as understood herein is a fixed input to a neuron. Such an input may be applied optically, for example as a fixed light input, or electrically, for example as a fixed current or voltage input. In some embodiments, the recovered current can be further processed locally using for example analog electronics or local digital lookup tables.

Summing may be performed in the optical or electrical domain or both depending on the weighting scheme. If optical weighting is used, then a single photodiode can effectively sum a portion or all of the weighted signals. If electrical weighting or in-detector weighting is used, all the resulting synaptic currents can be summed by wiring the weighted outputs together. Switches can be used at this level to direct currents from individual detectors to positive and negative lines which are then subtracted before thresholding. Summing may also be accomplished with dedicated active electronics such as summing amplifiers or adders.

Excitatory and inhibitory synapses can be defined at any of the above levels. In an optical weighting configuration, dedicated optical channels can be used. In some embodiments, within the same optical channel, spectrally-similar detectors with different responsivity magnitudes can be used to produce a net current with a certain polarity akin to balanced photodetectors (except with the same amount of light impinging on both detectors, differentiation must happen at the responsivity level). In one embodiment, identical detectors can sum their currents only after experimenting different amplification. In one embodiment, a single photodetector can be used in conjunction with an electrical switch to control if the current adds or subtracts with other synapses. In some embodiments, the sign of the weight can be defined in a local analog or digital processing unit.

Light routing action in networks implemented using the devices and methods disclosed herein may be implemented in various different ways. In one embodiment, the waveguiding action of the display itself (or lack thereof if patterned appropriately) is used to route light from the output of one neuron to an input of another. This can be accomplished by vertical stacking of elements and/or horizontal dielectric waveguides. In another embodiment, modulable filters, such as liquid crystal elements, may be positioned between the neurons to modulate transmission between different neurons. In some embodiments, wavelength-division multiplexing, i.e. using different colors and chromatic filters to transmit multiple signals across the same physical medium at once, can be used. For example, a given LED can transmit primarily or exclusively blue light, and blue filters can be positioned only over those detectors meant to receive the light emitted from the given LED, for example desired weight cells, neurons, or +/−photodetectors. In various embodiments, two, three, four, five, six, seven, eight, nine, ten, fifteen, twenty, or more distinct colors of light may be used, and all the different color channels can be configured to share the same physical path (e.g. waveguide). In some embodiments, visible light may be used, but in other embodiments, infrared light, ultraviolet light, or any wavelength or set of wavelengths generatable, filterable, and or detectable may be used, alone or in combination with visible light.

In some embodiments, multiple polarizations of light may be used, alternatively or in combination with wavelength-division multiplexing, to convey multiple channels along the same medium. These can be obtained by filtering light after emission and before detection, as well as by using emitters and detectors of different spectral profiles. This can be achieved with distinct materials or different device geometries (e.g. cavity effects, material thicknesses, etc.). Wavelength and polarization filtering can be achieved with chemical (e.g. thin-film molecular filters) or physical (e.g. nanophotonic or plasmonic structures) means. Multiple of the above methods can be combined to further diversify the available spectral responses, and hence the number of logical channels.

Figure 9:
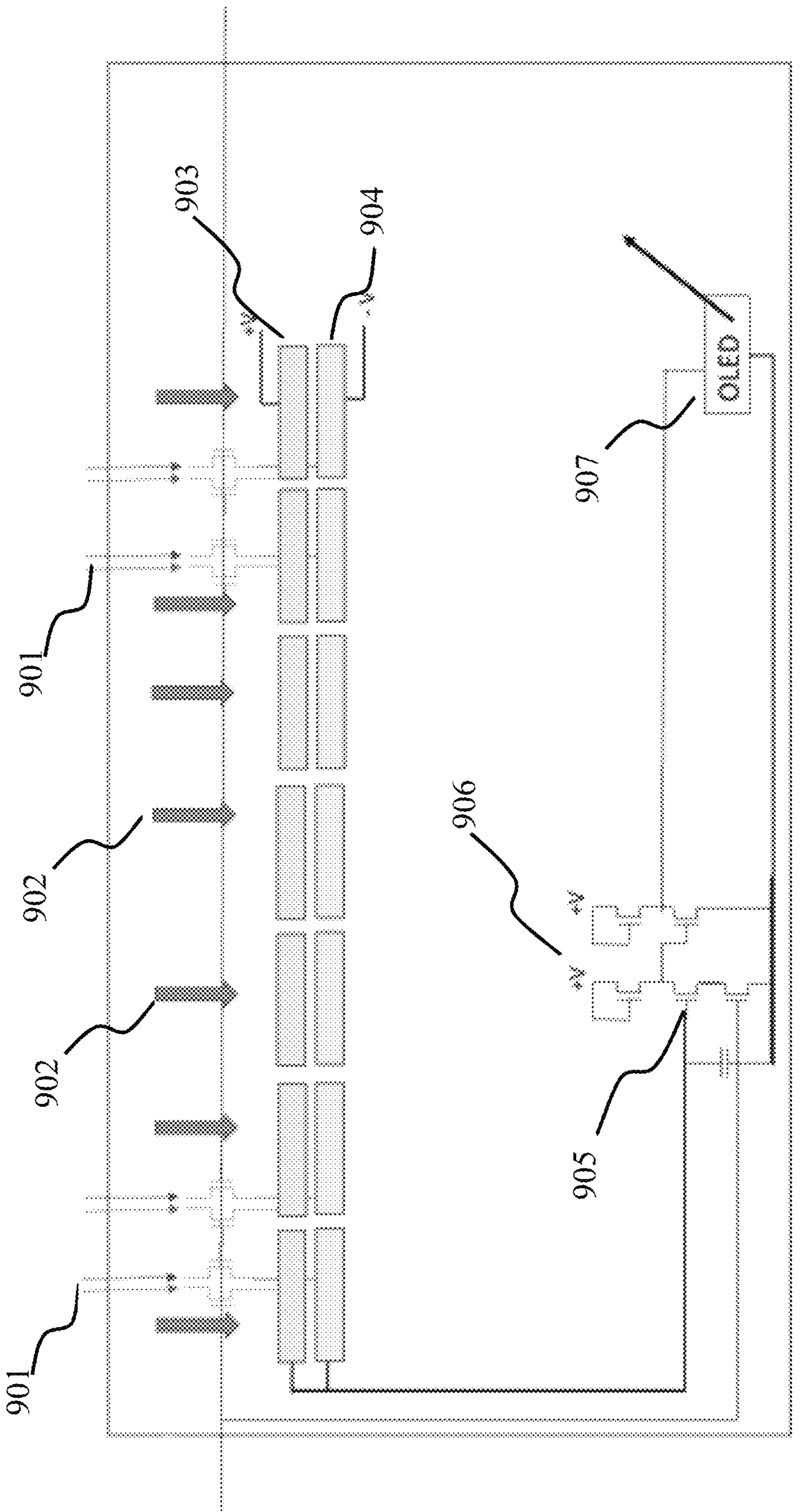
FIG. 9 shows a diagram of an exemplary multi-input weighted LED neuron.

One example of an optically connected neuron as part of a larger network is shown in FIG. 9. As shown, a single neuron may receive many optical inputs 902 from other neurons into one or more photodetectors, which may comprise a combination of excitory photodetectors 903 and inhibitory photodetectors 904. These could be detected by photodetectors or phototransistors whose optical gain can be controlled by an electrical signal 901, representing a weighting factor. Each optical input 903, 904 may therefore have its own detector and weighting factor. Weighting factors can be excitatory or inhibitory by which set of photodetectors are energized to process the input light. The photodetectors will therefore sum the weighted optical inputs and produce an electrical output 905 which could be applied to a threshold device 906, whose output can drive one or more LEDs or OLEDs 907 to pass optical connectivity to subsequent neurons, and therefore become their optical input signals.

In addition, multiple LEDs or OLEDs could be used having different output spectra. Arrays of photodetectors could be made to detect only specific wavelengths or the light from specific OLEDs—this could be accomplished by use of color filters applied to the photodetectors or the use of different spectral sensitivity materials in different photodetectors. As discussed elsewhere in this disclosure, having neurons process different wavelengths of light in parallel increases the processing power of the network.

In some embodiments, one or more neurons as disclosed herein may be integrated into an OLED display, which may for example be driven by thin-film transistors or otherwise, for example in microdisplay form. Many physical layers of this scheme can be implemented in the growth direction (i.e., the axis normal to the display surface) to yield a multilayer neural network. This can also be used to simply exploit the third dimension for more connectivity options in a network with effectively fewer layers. In general, many states can be associated with the same neuron (for example by subpixel subdivision) to achieve an effective multilayer network.

The disclosed systems have significant advantages over purely electronic approaches. For example, it is much easier to broadcast to many distant neurons using light, because there are fewer interconnect problems, especially when using color multiplexing. Summation may be implemented passively, simply by collecting light with photodetectors. In AR applications, some or all of the computing can be done at the display level itself. In some embodiments, a global switch can be configured to reset the neurons to some predefined state. Finally, typical display electronics can be used to adjust some or all pumping and weight values, as well as to read output voltages electronically if necessary. This allows the sequential use of different weight configurations conditional on the previous ones on the refresh rate timescale, which permits a wider variety of algorithms to be implemented. Spatially variant topologies are also easy to create this way by generating different weight templates at different areas of the LED display.

Combination with Other Materials

The materials described herein as useful for a particular layer in an organic light emitting device may be used in combination with a wide variety of other materials present in the device. For example, emissive dopants disclosed herein may be used in conjunction with a wide variety of hosts, transport layers, blocking layers, injection layers, electrodes and other layers that may be present. The materials described or referred to below are non-limiting examples of materials that may be useful in combination with the compounds disclosed herein, and one of skill in the art can readily consult the literature to identify other materials that may be useful in combination.

Various materials may be used for the various emissive and non-emissive layers and arrangements disclosed herein. Examples of suitable materials are disclosed in U.S. Patent Application Publication No. 2017/0229663, which is incorporated by reference in its entirety.

Conductivity Dopants

A charge transport layer can be doped with conductivity dopants to substantially alter its density of charge carriers, which will in turn alter its conductivity. The conductivity is increased by generating charge carriers in the matrix material, and depending on the type of dopant, a change in the Fermi level of the semiconductor may also be achieved. Hole-transporting layer can be doped by p-type conductivity dopants and n-type conductivity dopants are used in the electron-transporting layer.

HIL/HTL

A hole injecting/transporting material to be used in the present disclosure is not particularly limited, and any compound may be used as long as the compound is typically used as a hole injecting/transporting material.

EBL

An electron blocking layer (EBL) may be used to reduce the number of electrons and/or excitons that leave the emissive layer. The presence of such a blocking layer in a device may result in substantially higher efficiencies, and or longer lifetime, as compared to a similar device lacking a blocking layer. Also, a blocking layer may be used to confine emission to a desired region of an OLED. In some embodiments, the EBL material has a higher LUMO (closer to the vacuum level) and/or higher triplet energy than the emitter closest to the EBL interface. In some embodiments, the EBL material has a higher LUMO (closer to the vacuum level) and or higher triplet energy than one or more of the hosts closest to the EBL interface. In one aspect, the compound used in EBL contains the same molecule or the same functional groups used as one of the hosts described below.

Host

The light emitting layer of the organic EL device of the present disclosure preferably contains at least a metal complex as light emitting material, and may contain a host material using the metal complex as a dopant material. Examples of the host material are not particularly limited, and any metal complexes or organic compounds may be used as long as the triplet energy of the host is larger than that of the dopant. Any host material may be used with any dopant so long as the triplet criteria is satisfied.

HBL

A hole blocking layer (HBL) may be used to reduce the number of holes and/or excitons that leave the emissive layer. The presence of such a blocking layer in a device may result in substantially higher efficiencies and/or longer lifetime as compared to a similar device lacking a blocking layer. Also, a blocking layer may be used to confine emission to a desired region of an OLED. In some embodiments, the HBL material has a lower HOMO (further from the vacuum level) and or higher triplet energy than the emitter closest to the HBL interface. In some embodiments, the HBL material has a lower HOMO (further from the vacuum level) and or higher triplet energy than one or more of the hosts closest to the HBL interface.

ETL

An electron transport layer (ETL) may include a material capable of transporting electrons. The electron transport layer may be intrinsic (undoped), or doped. Doping may be used to enhance conductivity. Examples of the ETL material are not particularly limited, and any metal complexes or organic compounds may be used as long as they are typically used to transport electrons.

Charge Generation Layer (CGL)

In tandem or stacked OLEDs, the CGL plays an essential role in the performance, which is composed of an n-doped layer and a p-doped layer for injection of electrons and holes, respectively. Electrons and holes are supplied from the CGL and electrodes. The consumed electrons and holes in the CGL are refilled by the electrons and holes injected from the cathode and anode, respectively; then, the bipolar currents reach a steady state gradually. Typical CGL materials include n and p conductivity dopants used in the transport layers.

As previously disclosed, OLEDs and other similar devices may be fabricated using a variety of techniques and devices. For example, in OVJP and similar techniques, one or more jets of material is directed at a substrate to form the various layers of the OLED.

REFERENCES

The following publications are incorporated by reference herein in their entireties:

Abbott, L., Nelson, S. Synaptic plasticity: taming the beast. *Nat Neurosci* 3, 1178-1183 (2000). https://doi.org//10.1038/81453

Ashtiani, F., Risi, A., and Aflatouni, F. (2019). *Single-chip nanophotonic near-field imager*, Optica 6, 1255-1260

Boahen, K. A *Retinomorphic Chip with Parallel Pathways: Encoding INCREASING, ON, DECREASING, and OFF Visual Signals*. Analog Integrated Circuits and Signal Processing (2002) 30: 121

L. O. Chua and T. Roska (2002). Cellular neural networks and visual computing: Foundations and applications. Cambridge University Press.

L. O. Chua and L. Yang, "Cellular neural networks: theory," in IEEE Transactions on Circuits and Systems, vol. 35, no. 10, pp. 1257-1272, October 1988.

M. S. Elbamby, C. Perfecto, M. Bennis and K. Doppler, "Toward Low-Latency and Ultra-Reliable Virtual Reality," in IEEE Network, vol. 32, no. 2, pp. 78-84, March-April 2018.

Hany, et al. (2019) *Recent advances with optical upconverters made from all-organic and hybrid materials*, Science and Technology of Advanced Materials, 20:1, 497-510, DOI: 10.1080/14686996.2019.1610057

LeCun, Y., Bengio, Y., & Hinton, G. (2015). Deep learning. Nature, 521(7553), 436-444.

Matei, Radu. (2009). New Model and Applications of Cellular Neural Networks in Image Processing. 10.5772/8223.

Ramuz et al., *OLED and OPD-based mini-spectrometer integrated on a single-mode planar waveguide chip*, Eur. Phys. J. Appl. Phys. 46 (1) 12510 (2009), DOI: 10.1051/epj ap/2009025

Simonyan, K., and Zisserman, A. (2015). *Very Deep Convolutional Networks for Large-Scale Image Recognition*. Published as a conference paper at ICLR 2015.

Technavio (2016). Global Augmented Reality Market. Retrieved from Technavio database.

T. Tsujimura (2012). OLED displays: fundamentals and applications.

Wagner, Daniel (2018). Motion to Photon Latency in Mobile AR and VR [Blog post]. Retrieved from https://daqri.com/blog/motion-to-photon-latency/.

Watts, D., Strogatz, S. Collective dynamics of 'small-world' networks. *Nature* 393, 440-442 (1998). https://doi.org/10.1038/30918

The disclosures of each and every patent, patent application, and publication cited herein are hereby incorporated herein by reference in their entirety. While this invention has been disclosed with reference to specific embodiments, it is apparent that other embodiments and variations of this invention may be devised by others skilled in the art without departing from the true spirit and scope of the invention. The appended claims are intended to be construed to include all such embodiments and equivalent variations

What is claimed is:

1. A processing device comprising:

a plurality of artificial neurons comprising first and second artificial neurons;

at least one optical connection between an optical output of the first artificial neuron and an optical input of the second artificial neuron, the optical input comprising a photosensitive element;

at least one weighting element connected to the optical input of the second artificial neuron, configured to modify a gain of the optical input of the second artificial neuron; and at least one nonlinear element having an input and connected to the optical output of the first artificial neuron, configured to activate the optical output when a signal received at the input of the at least one nonlinear element rises above a threshold;

wherein the optical output of the first artificial neuron comprises at least one thin film organic light emitting diode (OLED).

2. The processing device of claim 1, further comprising at least one direct electrical connection between an electrical output of the first artificial neuron and an electrical input of the second artificial neuron.

3. The processing device of claim 1, wherein the at least one weighting element comprises an optical device configured to modulate an intensity of light received by the photodetector of the optical input of the second artificial neuron, selected from the group consisting of a liquid crystal, an interferometric modulator, a microelectromechanical device, and an electrochromic device.

4. The processing device of claim 1, wherein the photosensitive element is a thin-film photosensitive element.

5. The processing device of claim 1, wherein the at least one weighting element comprises an electronic device configured to modify an amplitude of an electrical signal generated at an output of the photodetector or an adjustable-gain input to the photodetector.

6. The processing device of claim 1, wherein the at least one nonlinear element comprises an LED, a thin film transistor inverter, or other circuit having electrical gain.

7. The processing device of claim 1, wherein the weighting element or the nonlinear element is reconfigurable.

8. The processing device of claim 1, wherein the second artificial neuron comprises:

a plurality of optical inputs and a plurality of weighting elements connected to the plurality of optical inputs;

a nonlinear element having an input and an output;

an optical output comprising a thin film OLED, connected to the output of the nonlinear element; and a summation element connected to a plurality of outputs of the plurality of weighting elements, configured to sum the plurality of outputs of the plurality of weighting elements and deliver the result to the nonlinear element.

9. The processing device of claim 8, wherein the summation element is the photosensitive element.

10. The processing device of claim 1, wherein the second artificial neuron comprises a memory.

11. The processing device of claim 10, wherein the memory is configured to store a quantity of information received from the first artificial neuron or from a third artificial neuron.

12. The processing device of claim 1, further comprising a sensor communicatively connected to an input of the first artificial neuron, the sensor selected from the group consisting of an image sensor, an attitude sensor, a position sensor, an accelerometer, a magnetometer, a charge-couples device, an organic image sensor, a photodetector, a LIDAR, and an ultrasonic sensor.

13. The processing device of claim 12, wherein the sensor is configured to generate an electrical signal in response to a mechanical, chemical, electrical, or radiation stimulus.

14. An apparatus comprising a consumer product, the consumer product comprising a processing device, the processing device comprising:

a plurality of artificial neurons comprising first and second artificial neurons;

at least one optical connection between an optical output of the first artificial neuron and an optical input of the second artificial neuron, the optical input comprising a photosensitive element;

at least one weighting element connected to the optical input of the second artificial neuron, configured to modify a gain of the optical input of the second artificial neuron; and at least one nonlinear element having an input and connected to the optical output of the first artificial neuron, configured to activate the optical output when a signal received at the input of the at least one nonlinear element rises above a threshold;

wherein the optical output of the first artificial neuron comprises at least one thin film organic light emitting diode (OLED); and wherein the consumer product is selected from the group consisting of a flat panel display, a curved display, a computer monitor, a medical monitor, a television, a billboard, a light for interior or exterior illumination and/or signaling, a heads-up display, a fully or partially transparent display, a flexible display, a rollable display, a foldable display, a stretchable display, a laser printer, a telephone, a mobile phone, a tablet, a phablet, a personal digital assistant (PDA), a wearable device, a laptop computer, a digital camera, a camcorder, a viewfinder, an imaging device, a micro-display (display that is less than 2 inches diagonal), a 3-D display, a virtual reality or augmented reality display, a vehicle, a video wall comprising multiple displays tiled together, a theater or stadium screen, and a non-transitory sign.

15. The apparatus of claim 14, wherein the consumer product further comprises at least one direct electrical connection between an electrical output of the first artificial neuron and an electrical input of the second artificial neuron.

16. The apparatus of claim 14, wherein the at least one weighting element comprises an optical device configured to modulate an intensity of light received by the photodetector of the optical input of the second artificial neuron, selected from the group consisting of a liquid crystal, an interferometric modulator, a microelectromechanical device, and an electrochromic device.

17. The apparatus of claim 14, wherein the photosensitive element is a thin-film photosensitive element.

18. The apparatus of claim 14, wherein the at least one weighting element comprises an electronic device configured to modify an amplitude of an electrical signal generated at an output of the photodetector or an adjustable-gain input to the photodetector.

19. The apparatus of claim 14, wherein the at least one nonlinear element comprises an LED, a thin film transistor inverter, or other circuit having electrical gain.

20. The apparatus of claim 14, wherein the weighting element or the nonlinear element is reconfigurable.

21. The apparatus of claim 14, wherein the second artificial neuron comprises:

a plurality of optical inputs and a plurality of weighting elements connected to the plurality of optical inputs;

a nonlinear element having an input and an output;

an optical output comprising a thin film OLED, connected to the output of the nonlinear element; and a summation element connected to a plurality of outputs of the plurality of weighting elements, configured to sum the plurality of outputs of the plurality of weighting elements and deliver the result to the nonlinear element.

22. The apparatus of claim 21, wherein the summation element is the photosensitive element.

23. The apparatus of claim 14, wherein the second artificial neuron comprises a memory.

24. The apparatus of claim 23, wherein the memory is configured to store a quantity of information received from the first artificial neuron or from a third artificial neuron.

25. The apparatus of claim 14, further comprising a sensor communicatively connected to an input of the first artificial neuron, the sensor selected from the group consisting of an image sensor, an attitude sensor, a position sensor, an accelerometer, a magnetometer, a charge-couples device, an organic image sensor, a photodetector, a LIDAR, and an ultrasonic sensor.

26. The apparatus of claim 25, wherein the sensor is configured to generate an electrical signal in response to a mechanical, chemical, electrical, or radiation stimulus.

* * * * *